(12) United States Patent
Shi et al.

(10) Patent No.: US 8,933,729 B1
(45) Date of Patent: Jan. 13, 2015

(54) STACKED RECEIVERS

(71) Applicant: Rambus Inc., Sunnyvale, CA (US)

(72) Inventors: Xudong Shi, Sunnyvale, CA (US); Reza Navid, San Francisco, CA (US); Jason Chia-Jen Wei, San Jose, CA (US); Huy M. Nguyen, San Jose, CA (US); Kambiz Kaviani, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/834,970

(22) Filed: Mar. 15, 2013

Related U.S. Application Data

(60) Provisional application No. 61/618,508, filed on Mar. 30, 2012.

(51) Int. Cl.
*H03B 1/00* (2006.01)
*H03K 3/00* (2006.01)
*H03F 3/45* (2006.01)
*H03K 5/00* (2006.01)

(52) U.S. Cl.
CPC .............. *H03F 3/45636* (2013.01); *H03K 5/00* (2013.01)

USPC ............. 327/108; 327/109; 327/112; 326/30; 326/68; 326/82; 326/87; 375/267; 375/340

(58) Field of Classification Search
CPC ....... H03F 3/195; H03F 1/0277; H03F 3/245; H03F 2203/45408
USPC .......... 327/108, 109, 112; 326/30, 68, 82, 87; 375/267, 340
See application file for complete search history.

(56) References Cited

U.S. PATENT DOCUMENTS 6,448,806 B1 * 9/2002 Roth ................................ 326/16
8,030,967 B1 * 10/2011 Tan et al. ......................... 326/83

* cited by examiner

*Primary Examiner* — John Poos
(74) *Attorney, Agent, or Firm* — The Neudeck Law Firm, LLC

(57) ABSTRACT

Differential receivers are "stacked" and independently calibrated to different common-mode voltages. The different common-mode voltages may correspond to the common-mode voltages of stacked transmission circuits. Multiple stacks of samplers are connected to the same channels. The clocking of each stack of sampler circuits is phased (timed) such that the samplers in a given stack are not resolving at the same time. Samplers in a different stack and receiving a different common-mode voltage resolve at the same time.

18 Claims, 12 Drawing Sheets

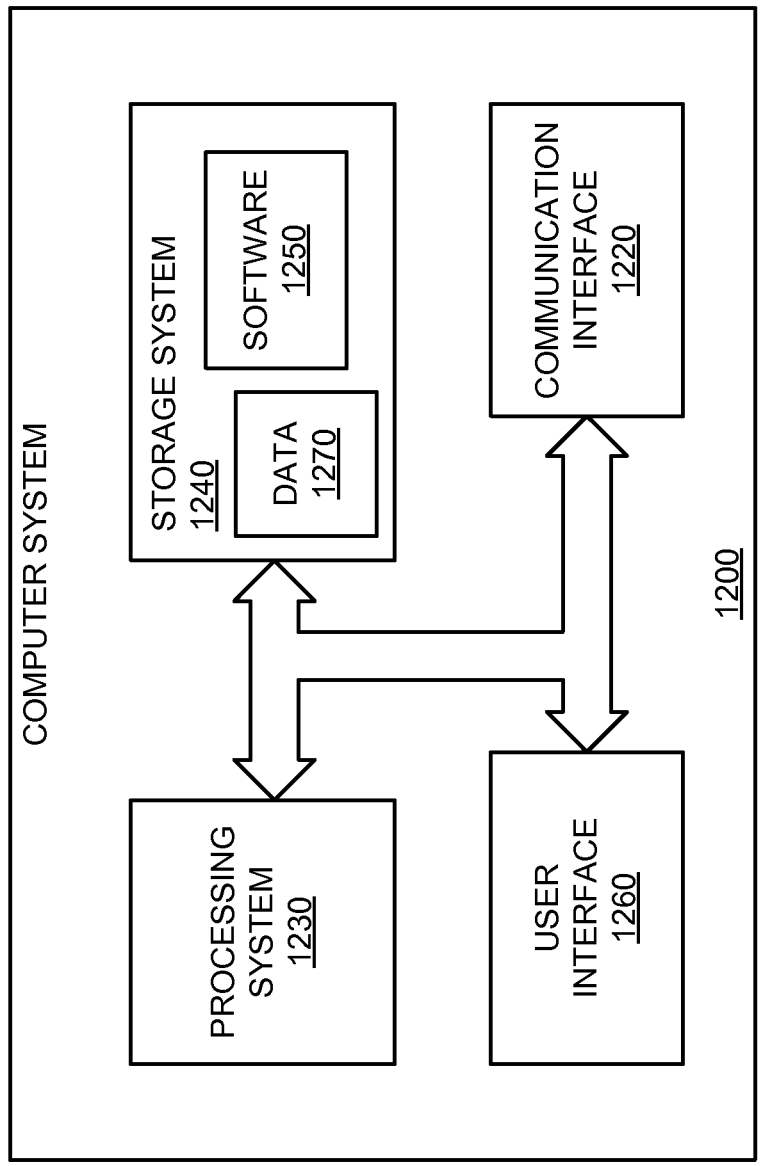

US 8,933,729 B1

STACKED RECEIVERS

BRIEF DESCRIPTION OF THE DRAWINGS

FIG. 12 is a block diagram of a computer system.

DETAILED DESCRIPTION

In an embodiment, differential receivers are "stacked" and independently calibrated to different common-mode voltages. The different common-mode voltages may correspond to the common-mode voltages of stacked transmission circuits. "Stacking" refers to recycling the current of a first (i.e., higher common-mode voltage) receiver/sampler/transmitter circuit to power a second (or more) receiver/sampler/transmitter circuit. For example, two or more differential signal (or single-ended signal) receiver circuits are stacked such that the current drawn from the power supply from a first (top) receiver circuit is also used by a second (bottom or intermediate) receiver circuit. Thus, the current sent out the negative power supply terminal by the first receiver circuit is sent to an intermediate node and used by the second receiver circuit as a positive power supply. Sampler type receiver circuits, and transmitter circuits, may also be stacked.

In another embodiment, multiple stacks of samplers are connected to the same channels. The clocking of each stack of sampler circuits is phased (timed) such that the samplers in a given stack are not resolving at the same time. Samplers in a different stack that receive different common-mode voltages resolve at the same time. For example, in a two common-mode voltage communication system (e.g., high common-mode and low common-mode) with two stacks (e.g., a first stack and second stack), when the high-common-mode sampler of the first stack is resolving, the low common-mode sampler of the first stack is holding its state. At the same time (i.e., when the high-common-mode sampler of the first stack is resolving), the high-common-mode sampler of the second stack is holding its state and the low common-mode sampler of the second stack is resolving. Likewise, during a different clock phase, when the high-common-mode sampler of the first stack is holding, the low common-mode sampler of the first stack is sampling. At the same time (i.e., when the high-common-mode sampler of the first stack is holding), the high-common-mode sampler of the second stack is sampling and the low common-mode sampler of the second stack is holding.

Figure 1:
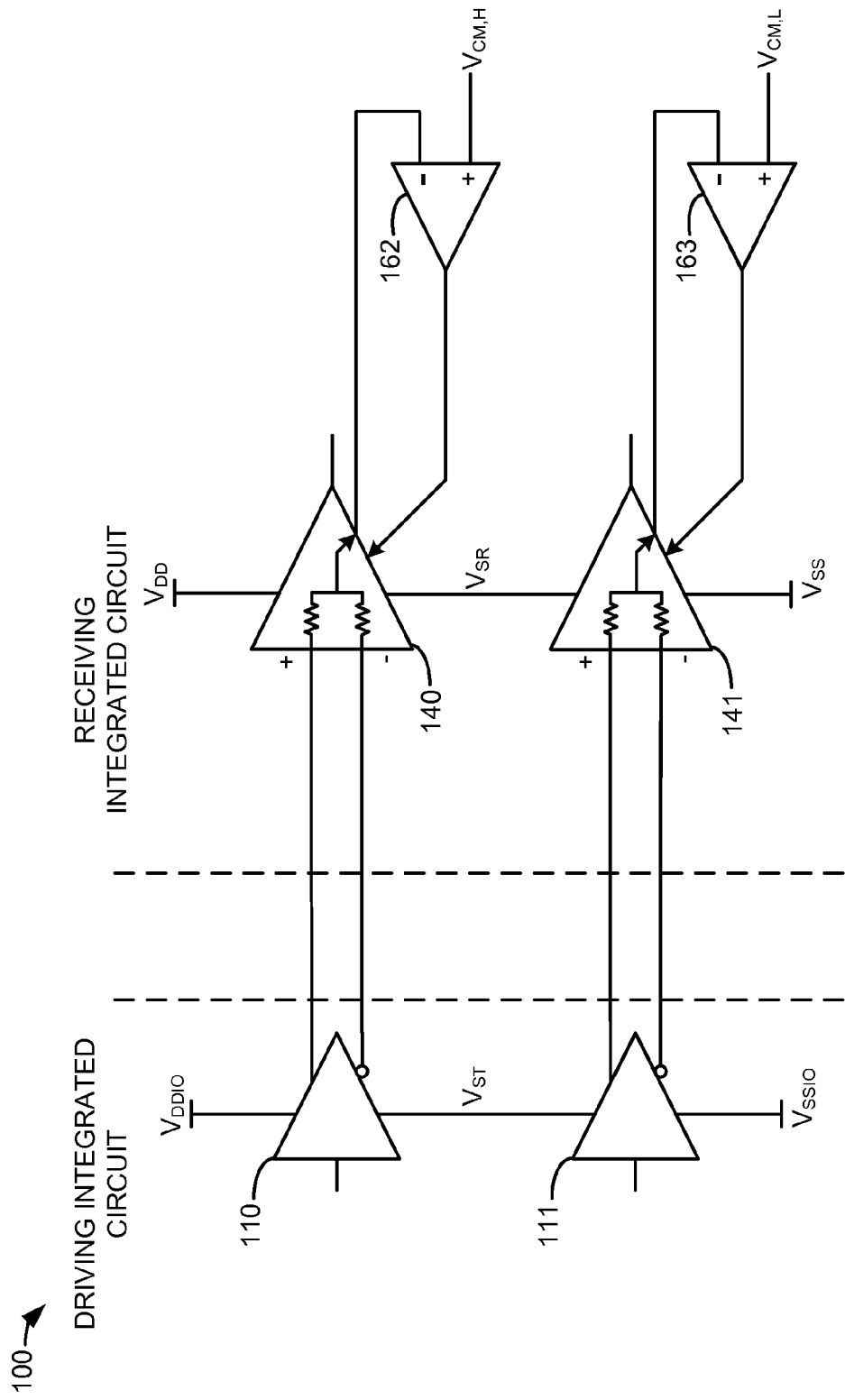
FIG. 1 is a block diagram illustrating a communication system with stacked receivers.

FIG. 1 is a block diagram illustrating a communication system with stacked receivers. In FIG. 1, communication system 100 comprises transmitter circuit 110, transmitter circuit 111, receiver circuit 140, receiver circuit 141, comparator 162, and comparator 163. Receiver circuits 140-141 may comprise, or function like, common-gate type receivers. Receiver circuits 140-141 may comprise, or function like other types of receivers such common-source or common-drain. It should also be understood that single-ended receivers and signaling could also be used. As illustrated in FIG. 1, transmitter circuits 110-111 are typically included on an integrated circuit that is driving differential signals. Receiver circuits 140-141 and comparators 162-163 are typically part of an integrated circuit that is receiving differential signals.

In FIG. 1, the positive supply terminal of transmitter circuit 110 is connected to a positive power supply, $V_{DDIO}$, of the driving integrated circuit. The negative power supply terminal of transmitter circuit 110 is connected to an intermediate node, $V_{ST}$. For convenience, $V_{ST}$ may also be used to refer to the voltage on the intermediate node $V_{ST}$ relative to a negative power supply, $V_{SSIO}$, of the driving integrated circuit. The non-inverting output of transmitter circuit 110 is connected to the non-inverting input of receiver circuit 140. The inverting output of transmitter circuit 110 is connected to the inverting input of receiver circuit 140.

The positive supply terminal of transmitter circuit 111 is connected to the intermediate node $V_{ST}$. Thus, transmitter circuit 111 receives its positive power supply current from the negative supply terminal of transmitter circuit 110. The negative power supply terminal of transmitter circuit 111 is connected to the negative power supply, $V_{SSIO}$, of the driving integrated circuit. The non-inverting output of transmitter circuit 111 is connected to the non-inverting input of receiver circuit 141. The inverting output of transmitter circuit 111 is connected to the inverting input of receiver circuit 141.

A two-transmitter stack is illustrated in FIG. 1. It should be understood, however, that more than two transmitters may be stacked. A multi-transmitter stack may have more than two transmitters in series. A multi-transmitter stack would have all transmitter circuits but the transmitter circuit connected to the positive supply receiving their positive supply voltage from another transmitter circuit in the stack. To receive the signals from a multi-transmitter stack, more than two receiver circuits may be provided. Each receiver circuit may have an appropriate common-mode voltage at their respective inputs.

The positive supply terminal of receiver circuit 140 is connected to a positive power supply, $V_{DD}$, of the receiving integrated circuit. The negative power supply terminal of receiver circuit 140 is connected to an intermediate node, $V_{SR}$. For convenience, $V_{SR}$ may also be used to refer to the voltage on the intermediate node $V_{SR}$ relative to a negative power supply, $V_{SS}$, of the receiving integrated circuit. The positive supply terminal of receiver circuit 141 is connected to the intermediate node $V_{SR}$. Thus, receiver circuit 141 receives its positive power supply current from the negative supply terminal of receiver circuit 140. The negative power supply terminal of receiver circuit 141 is connected to the negative power supply, $V_{SS}$, of the receiving integrated circuit.

In FIG. 1, receiver circuit 140 provides the common-mode voltage of its input (or an indicator thereof) to the inverting input of comparator 162. Comparator 162 receives a first target common-mode voltage, $V_{CM,H}$. $V_{CM,H}$ typically is a voltage associated with the common-mode voltage output by an upper transmitter circuit (e.g. transmitter circuit 110) of a stacked pair of transmitter circuits. $V_{CM,H}$ may be generated from $V_{DD}$, $V_{DDIO}$, or some other voltage or parameter that has a correspondence to the common-mode voltage output by transmitter circuit 110. For example, $V_{CM,H}$ may be generated using a resistor divider network forming an arbitrary function of $V_{DDIO}$ and $V_{ST}$ (e.g., $V_{CM,H}$=f($V_{DDIO}$,$V_{ST}$)). In a specific example, $V_{CM,H}$ may equal ($V_{DDIO}$+$V_{ST}$)/2.

$V_{CM,H}$ is used as the control input of a feedback loop to set the common-mode voltage of receiver circuit 140's input. Comparator 162 outputs a signal indicating whether the common-mode voltage of receiver circuit 140 is at a higher or lower voltage than the first target voltage $V_{CM,H}$. The common-mode voltage of receiver circuit 140 is affected by the output of comparator 140 to raise or lower the common-mode voltage. In response to the output of comparator 162, the common-mode voltage of receiver circuit 140 is raised or lowered depending on whether comparator 162 indicates that the common-mode voltage of receiver circuit 140's input is lower or higher, respectively, than $V_{CM,H}$. These adjustments cause the common-mode voltage of receiver circuit 140's input to stabilize at or near the first target voltage $V_{CM,H}$.

In FIG. 1, receiver circuit 141 provides the common-mode voltage of its input (or an indicator thereof) to the inverting input of comparator 163. Comparator 163 receives a second target common-mode voltage, $V_{CM,L}$. $V_{CM,L}$ typically is a voltage associated with the common-mode voltage output by a lower transmitter circuit (e.g. transmitter circuit 111) of a stacked pair of transmitter circuits. $V_{CM,L}$ may be generated from $V_{DD}$, $V_{DDIO}$, or some other voltage or parameter that has a correspondence to the common-mode voltage output by transmitter circuit 111. For example, $V_{CM,L}$ may be generated using a resistor divider network forming an arbitrary function of $V_{SS}$ and $V_{ST}$ (e.g., $V_{CM,L}$=f($V_{SS}$,$V_{ST}$)).

$V_{CM,L}$ is used as the control input of a feedback loop to set the common-mode voltage of receiver circuit 141. Comparator 163 outputs a signal indicating whether the common-mode voltage of receiver circuit 141 is at a higher or lower voltage than the second target voltage $V_{CM,L}$. The common-mode voltage of receiver circuit 141 is affected by the output of comparator 141 to raise or lower the common-mode voltage. In response to the output of comparator 163 the common-mode voltage of receiver circuit 141 is raised or lowered depending on whether comparator 163 indicated the common-mode of receiver circuit 141's input is lower or higher, respectively, than $V_{CM,L}$. These adjustments cause the common-mode voltage of receiver circuit 141's input to stabilize at or near the second target voltage $V_{CM,L}$. In FIG. 1, $V_{CM,H}$ and $V_{CM,L}$ are input to the inverting input of comparators 162 and 163, respectively. However, it should be understood that as long as the entire bias feedback loop has a negative polarity feedback, $V_{CM,H}$ and $V_{CM,L}$ may be input to a different input or other circuitry.

Figure 2:
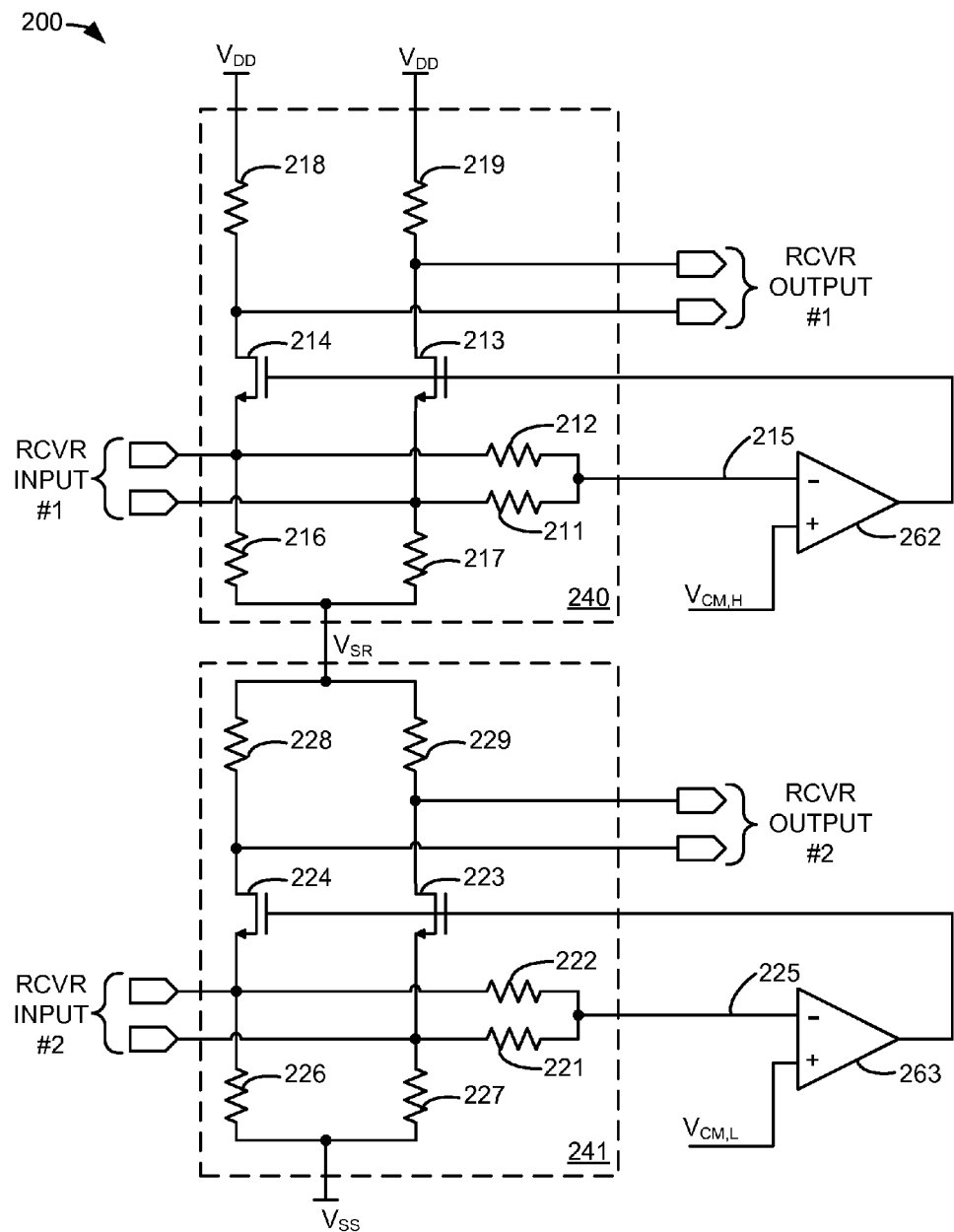
FIG. 2 is a schematic diagram illustrating stacked common-gate type receivers.

FIG. 2 is a schematic diagram illustrating common-gate type stacked receivers. In FIG. 2, a receiver system 200 comprises a receiver circuit 240, a receiver circuit 241, a comparator 262, and a comparator 263. Receiver circuit 240 comprises a termination resistor 211, a termination resistor 212, resistors 216-219, a n-channel field effect transistor (NFET) 213, and a NFET 214. The input to receiver circuit 240 is a differential voltage signal received between the source of NFET 213 and the source of NFET 214. The output of receiver circuit 240 may be a differential voltage generated between the drains of NFET 213 and NFET 214. Receiver circuit 241 comprises a termination resistor 221, a termination resistor 222, resistors 226-229, a NFET 223, and a NFET 224. The input to receiver circuit 241 is a differential voltage signal received between the source of NFET 223 and the source of NFET 224. The output of receiver circuit 241 may be a differential voltage generated between the drains of NFET 223 and NFET 224.

The positive supply terminal of receiver circuit 240 is connected to a positive power supply, $V_{DD}$. The negative power supply terminal of receiver circuit 240 is connected to an intermediate node, $V_{SR}$. The positive supply terminal of receiver circuit 241 is connected to the intermediate node $V_{SR}$. Thus, receiver circuit 241 receives its positive power supply current from the negative supply terminal of receiver circuit 240. The negative power supply terminal of receiver circuit 241 is connected to a negative power supply, $V_{SS}$, of the receiving integrated circuit. It should be noted that, for convenience, $V_{SR}$ may also be used to refer to the voltage on the intermediate node $V_{SR}$ relative to the negative power supply, $V_{SS}$, of FIG. 2.

Regarding receiver circuit 241, a first terminal of resistor 228 is connected to the intermediate node, $V_{SR}$. A second terminal of resistor 228 is connected to the drain of NFET 224. A first terminal of resistor 226 is connected to the source of NFET 224. A second terminal of resistor 226 is connected to the negative power supply, $V_{SS}$. A first terminal of resistor 229 is connected to the intermediate node, $V_{SR}$. A second terminal of resistor 229 is connected to the drain of NFET 223. Resistor 228 and resistor 229 typically have the same, or approximately the same, value. A first terminal of resistor 227 is connected to the source of NFET 223. A second terminal of resistor 227 is connected to the negative power supply, $V_{SS}$. The impedances of resistors 226 and 227 are typically the same, or closely approximate each other.

A first terminal of termination resistor 221 is connected to the source of NFET 223. A second terminal of termination resistor 221 is connected to node 225. A first terminal of termination resistor 222 is connected to the source of NFET 224. A second terminal of termination resistor 222 is connected to node 225. Thus, when termination resistor 221 and termination resistor 222 have the same value, the voltage on node 225 reflects the common-mode voltage of the input of receiver circuit 241. Typically, termination resistors 221 and 222 will have the same value. Termination resistors 221 and 222 may be controlled resistors that are calibrated.

The output of comparator 263 is connected to the gates of NFET 223 and NFET 224. Thus, the current flowing through NFETs 223 and 224 is determined by the output of comparator 263. It should be understood that receiver circuit 241 comprises a common-gate type differential amplifier that amplifies the voltage differential at the input of receiver circuit 241 to produce an output between the drains of NFET 223 and 224. Receiver circuit 241 may be configured to receive a common-mode voltage and voltage swings compatible with the lower common-mode transmitter of the stacked transmitters shown and discussed in relation to FIG. 1.

Because the output of comparator 263 determines the current flowing through NFETs 223 and 224, the output of comparator 263 determines the current flowing through resistor 226 and the current flowing through resistor 227. The currents flowing through resistor 226 and resistor 227 determine the common-mode voltage seen at the differential input of receiver circuit 241 relative to the negative power supply, $V_{SS}$.

In an embodiment, the inverting input of comparator 263 is coupled to node 225. Thus, the inverting input of comparator 263 receives a voltage that reflects the common-mode voltage of receiver circuit 241. Comparator 263 receives a target voltage $V_{CM,L}$ at its non-inverting input. The target voltage $V_{CM,L}$ is used as the control input of a feedback loop. The feedback voltage of the feedback loop is derived from node

225. Comparator 263 outputs a signal that indicates whether node 225 is at a higher or lower voltage than the target voltage $V_{CM,L}$. The output of comparator 263, by changing the voltage on the gates of NFETs 223 and 224, causes the current flowing through resistors 226 and 227 to increase or decrease according to whether the voltage at node 225 is at a lower or higher voltage, respectively, than the target voltage $V_{CM,L}$. These adjustments to the voltage on the gates of NFETs 223 and 224 cause the voltage on node 225 to stabilize at or near the target voltage $V_{CM,L}$.

For example, if node 225 is lower than the target voltage $V_{CM,L}$, comparator 263 will increase the voltage on the gates of NFETs 223 and 224. The increased gate voltages of NFETs 223 and 224 cause NFETs 223 and 224 to conduct more current. This increased current through NFETs 223 and 224, increases the amount of current flowing though resistors 227 and 226, respectively. The increased current flowing though resistors 226 and 227 increases the voltage at the source nodes of NFETs 223 and 224. This causes the voltage at node 225 to increase—thus closing the feedback loop.

If node 225 is higher than the target voltage $V_{CM,L}$, comparator 263 will decrease the voltage on the gates of NFETs 223 and 224. The decreased gate voltages of NFETs 223 and 224 cause NFETs 223 and 224 to conduct less current. This decreased current through NFETs 223 and 224, decreases the amount of current flowing though resistors 227 and 226, respectively. The decreased current flowing though resistors 226 and 227 decreases the voltage at the source nodes of NFETs 223 and 224. This causes the voltage at node 225 to decrease. As can be understood from the foregoing, the feedback loop formed by comparator 263, and the elements of receiver circuit 241 cause the voltage at node 225 to stabilize at a value that matches or approximates the target voltage $V_{CM,L}$.

Regarding receiver circuit 240, a first terminal of resistor 218 is connected to the positive power supply terminal, $V_{DD}$. A second terminal of resistor 218 is connected to the drain of NFET 214. A first terminal of resistor 216 is connected to the source of NFET 214. A second terminal of resistor 216 is connected to intermediate node $V_{SR}$. A first terminal of resistor 219 is connected to the positive power supply terminal, $V_{DD}$. A second terminal of resistor 219 is connected to the drain of NFET 213. Resistor 218 and resistor 219 typically have the same, or approximately the same, value. A first terminal of resistor 217 is connected to the source of NFET 213. A second terminal of resistor 217 is connected to the intermediate node $V_{SR}$. The impedances of resistors 216 and 217 are typically the same, or closely approximate each other.

A first terminal of termination resistor 211 is connected to the source of NFET 213. A second terminal of termination resistor 211 is connected to node 215. A first terminal of termination resistor 212 is connected to the source of NFET 214. A second terminal of termination resistor 212 is connected to node 215. Thus, when termination resistor 211 and termination resistor 212 have the same value, the voltage on node 215 reflects the common-mode voltage of the input of receiver circuit 240. Typically, termination resistors 211 and 212 will have the same value. Termination resistors 211 and 212 may be controlled resistors that are calibrated.

The output of comparator 262 is connected to the gates of NFET 213 and NFET 214. Thus, the current flowing through NFETs 213 and 214 is determined by the output of comparator 262. It should be understood that receiver circuit 240 comprises a common-gate type differential amplifier that amplifies the voltage differential at the input of receiver circuit 240 to produce an output between the drains of NFET 213 and 214. Receiver circuit 240 may be configured to receive a common-mode voltage and voltage swings compatible with the higher common-mode transmitter of the stacked transmitters shown and discussed in relation to FIG. 1.

Because the output of comparator 262 determines the current flowing through NFETs 213 and 214, the output of comparator 262 determines the current flowing through resistor 216 and the current flowing through resistor 217. The currents flowing though resistor 216 and resistor 217 determine the common-mode voltage seen at the differential input of receiver circuit 240 relative to the intermediate node $V_{SR}$.

In an embodiment, the inverting input of comparator 262 is coupled to node 215. Thus, the inverting input of comparator 262 receives a voltage that reflects the common-mode voltage of receiver circuit 240. Comparator 262 receives a target voltage $V_{CM,H}$ at its non-inverting input. The target voltage $V_{CM,H}$ is used as the control input of a feedback loop. The feedback voltage of the feedback loop is derived from node 215. Comparator 262 outputs a signal that indicates whether node 215 is at a higher or lower voltage than the target voltage $V_{CM,H}$. The output of comparator 262, by changing the voltage on the gates of NFETs 213 and 214, causes the current flowing through resistors 216 and 217 to increase or decrease according to whether the voltage at node 215 is at a lower or higher voltage, respectively, than the target voltage $V_{CM,H}$. These adjustments to the voltage on the gates of NFETs 213 and 214 cause the voltage on node 215 to stabilize at or near the target voltage $V_{CM,H}$.

For example, if node 215 is lower than the target voltage $V_{CM,H}$, comparator 262 will increase the voltage on the gates of NFETs 213 and 214. The increased gate voltages of NFETs 213 and 214 cause NFETs 213 and 214 to conduct more current. This increased current through NFETs 213 and 214, increases the amount of current flowing though resistors 217 and 216, respectively. The increased current flowing though resistors 216 and 217 increases the voltage at the source nodes of NFETs 213 and 214. This causes the voltage at node 215 to increase—thus closing the feedback loop.

If node 215 is higher than the target voltage $V_{CM,H}$, comparator 262 will decrease the voltage on the gates of NFETs 213 and 214. The decreased gate voltages of NFETs 213 and 214 cause NFETs 213 and 214 to conduct less current. This decreased current through NFETs 213 and 214 decreases the amount of current flowing though resistors 217 and 216, respectively. The decreased current flowing though resistors 216 and 217 decreases the voltage at the source nodes of NFETs 213 and 214. This causes the voltage at node 215 to decrease. As can be understood from the foregoing, the feedback loop formed by comparator 262, and the elements of receiver circuit 240 cause the voltage at node 215 to stabilize at a value that matches or approximates the target voltage $V_{CM,H}$. It should be understood that $V_{CM,H}$ and $V_{CM,L}$ may be selected and/or generated as discussed in relation to FIG. 1.

It should also be understood that, in order to prevent them from fighting each other, or to form a more stable system, the feedback loops formed by comparators 262 and 263 may be alternately and successively controlled to operate. In other words, for example, the feedback loop formed by comparator 262 may be allowed to operate until it stabilizes while the feedback loop formed by comparator 263 is held in a steady state. Then, the feedback loop formed by comparator 263 may be allowed to operate until it stabilizes while the feedback loop formed by comparator 262 is held in a steady state. These two steps may be repeated until a steady state (or near steady state) condition is achieved.

Figure 3:
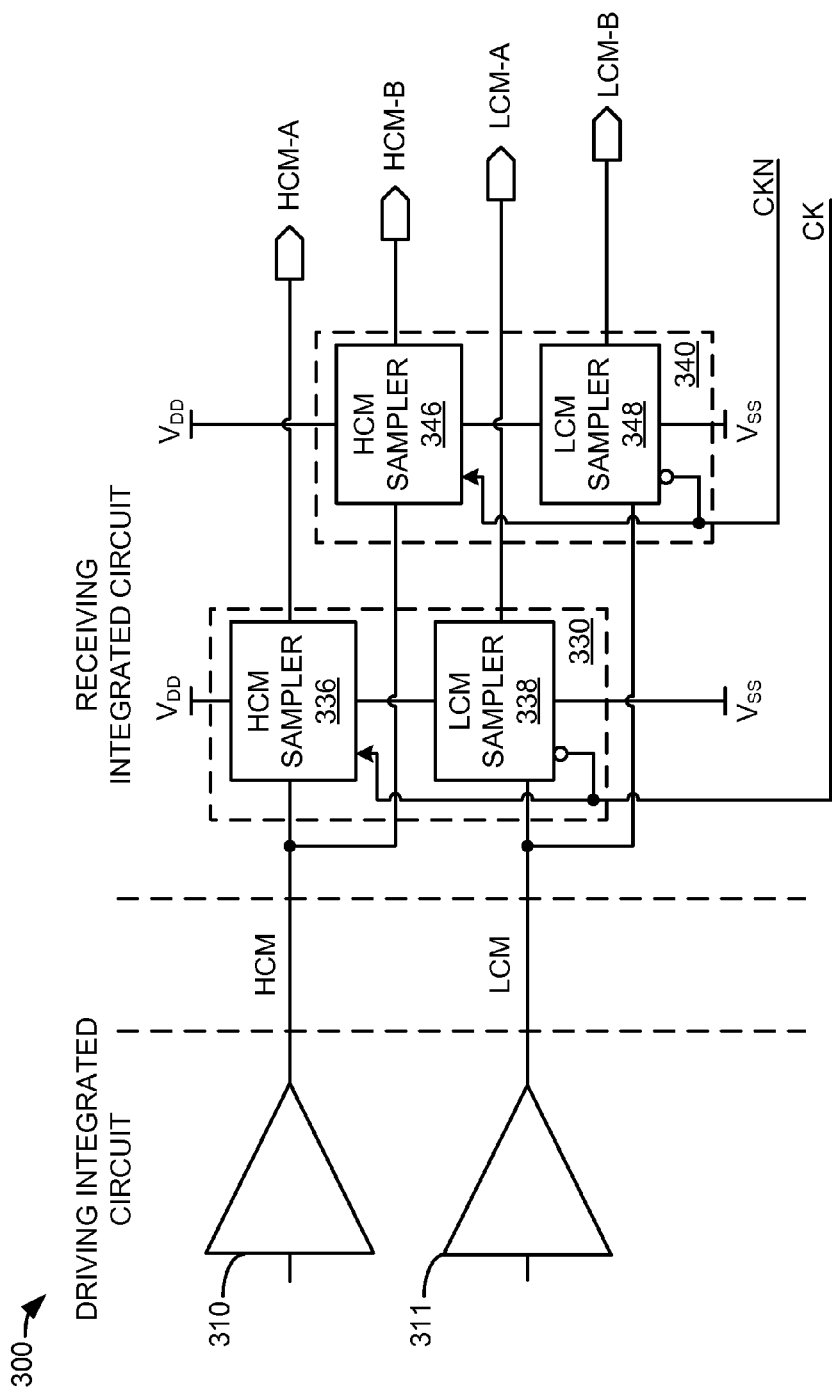
FIG. 3 is a block diagram illustrating a communication system with multi-phase stacked samplers.

FIG. 3 is a block diagram illustrating a communication system 300 with multi-phase stacked samplers. In FIG. 3, communication system 300 comprises a transmitter circuit 310, a transmitter circuit 311, a stacked sampler circuit 330, and a stacked sampler circuit 340. Stacked sampler circuit 330 comprises a high common-mode sampler (HCM sampler) 336 and a low common-mode sampler (LCM sampler) 338. Stacked sampler circuit 340 comprises a HCM sampler 346 and a LCM sampler 348.

The positive supply terminal of HCM sampler 336 is connected to a positive power supply, $V_{DD}$, of the receiving integrated circuit. The negative power supply terminal of HCM sampler 336 is connected to an intermediate node of stacked sampler circuit 330. The positive supply terminal of LCM sampler 338 is connected to the intermediate node of stacked sampler circuit 330. Thus, LCM sampler 338 receives its positive power supply current from the intermediate node connected to the negative supply terminal of HCM sampler 336. The negative power supply terminal of LCM sampler 338 is connected to a negative power supply, $V_{SS}$, of the receiving integrated circuit.

The positive supply terminal of HCM sampler 346 is connected to positive power supply, $V_{DD}$, of the receiving integrated circuit. The negative power supply terminal of HCM sampler 346 is connected to an intermediate node of stacked sampler circuit 340. The positive supply terminal of LCM sampler 348 is connected to the intermediate node of stacked sampler circuit 340. Thus, LCM sampler 348 receives its positive power supply current from the intermediate node connected to the negative supply terminal of HCM sampler 346. The negative power supply terminal of LCM sampler 348 is connected to negative power supply, $V_{SS}$, of the receiving integrated circuit.

Stacked sampler circuit 330 and stacked sampler circuit 340 are illustrated in FIG. 3 as two-sampler (i.e., HCM sampler and LCM sampler) stacks. It should be understood, however, that more than two samplers may be stacked. A multi-sampler stack may have more than two samplers with their power supply terminals connected in series. Thus, all but the sampler connected to the positive supply receive their positive supply voltage from another sampler in the stack.

As illustrated in FIG. 3, transmitter circuits 310-311 would typically be included on an integrated circuit that is driving signals. Stacked sampler circuit 330 and stacked sampler circuit 340 would typically be part of an integrated circuit that is receiving signals. It should be understood that the signals driven from transmitter circuit 310 and transmitter circuit 311 to stacked sampler circuit 330 and stacked sampler circuit 340, respectively, of the receiving integrated circuit may be single-ended signals driven on a single conductor (as shown in FIG. 3) or differential signals driven on at least two conductors (not shown in FIG. 3).

In FIG. 3, the driving integrated circuit is illustrated with transmitter circuit 310 and transmitter circuit 311. In an embodiment, transmitter circuit 310 drives a high common-mode (HCM) signal and transmitter circuit 311 drives a low common-mode (LCM) signal. However, the driving integrated circuit may be configured such that the opposite is true (i.e., transmitter circuit 310 drives a LCM signal and transmitter circuit 311 drives an HCM signal.) It should be understood that high common-mode and low common-mode are relative terms. High common-mode and low common-mode are intended to convey common-mode voltages relative to each other. That is, high common-mode is intended to convey a common-mode voltage that is greater than or equal to the low common-mode voltage. It is not intended to convey any particular difference between these two common-mode voltages. Nor is it intended to convey any particular absolute (i.e., with reference to $V_{SS}$) common-mode voltage or signal standard (e.g., Near-VDD signaling or Near Ground Signaling).

In FIG. 3, transmitter circuit 310 and transmitter circuit 311 are not illustrated as a transmitter stack. That is because transmitter stacking is not necessary to convey signals to be received by stacked sampler circuit 330 and stacked sampler circuit 340. However, it should be understood that transmitter circuit 310 and transmitter circuit 311 may be stacked. Similar to transmitter circuits 110 and 111 illustrated in FIG. 1, the positive supply terminal of transmitter circuit 310 may be connected to positive power supply of the driving integrated circuit. The negative power supply terminal of transmitter circuit 310 may be connected to an intermediate node of the driving integrated circuit. The positive supply terminal of transmitter circuit 311 may be connected to the intermediate node. And, the negative power supply terminal of transmitter circuit 311 may be connected to negative power supply of the driving integrated circuit.

Two transmitter circuits are illustrated in FIG. 3. It should be understood, however, that more than two transmitters, each with appropriate common-mode voltages, may drive signals to the receiving integrated circuit. To receive these signals, more than two samplers per stacked sampler circuit 330, 340, each designed to resolve signals with an appropriate common-mode voltage at their input, may be provided. It should also be understood that, in an alternate embodiment, transmitter circuits 310 and 311 can have the same or similar common-mode voltages. In this case, an additional receiving circuit (e.g., a common-gate amplifier) may be present to level shift the signals from one or both of transmitter circuits 310 and 311 to appropriate common-mode voltages before being input to stacked sampler circuits 330 and/or 340.

In an embodiment, stacked sampler circuit 330 receives a timing reference signal (i.e., clock signal) CK. CK is coupled to an active high clock input of HCM sampler 336. CK is coupled to HCM sampler 336 such that HCM sampler 336 will sample the signal received from transmitter circuit 310 when CK is high, and hold the resolved logic value when CK is low. CK is also coupled to an active low clock input of LCM sampler 338. CK is also coupled to LCM sampler 338 such that LCM sampler 338 will sample the signal received from transmitter circuit 311 when CK is low, and hold the resolved logic value when CK is high. Stacked sampler circuit 340 receives a timing reference signal CKN. CKN is typically the complement of CK. CKN is coupled to an active high clock input of HCM sampler 346. CKN is coupled to HCM sampler 346 such that HCM sampler 346 will sample the signal received from transmitter circuit 311 when CKN is high, and hold the resolved logic value when CKN is low. CKN is also coupled to an active low clock input of LCM sampler 348. CKN is coupled to LCM sampler 348 such that LCM sampler 348 will sample the signal received from transmitter circuit 311 when CKN is low, and hold the resolved logic value when CKN is high.

The outputs of HCM sampler 336, HCM sampler 346, LCM sampler 338, and LCM sampler 348 are labeled HCM-A, HCM-B, LCM-A, and LCM-B, respectively. Thus, in FIG. 3, the outputs of stacked sampler circuit 330 end in "-A" and the outputs of stacked sampler circuit 340 end in "-B".

When CK and CKN are complements of each other, and CK is high, HCM sampler 336 will be sampling (resolving) at the same time LCM sampler 348 is sampling. Likewise, when CK is high, HCM sampler 346 will be holding a resolved logic value at the same time LCM sampler 338 is holding its resolved logic value. When CK is low, LCM sampler 338 will be sampling at the same time HCM sampler 346 is sampling and HCM sampler 336 will be holding a resolved logic value at the same time LCM sample 348 is holding its resolved logic value. Thus, during any given phase of CK (or CKN), the signals from both transmitter circuit 310 and transmitter circuit 311 are being sampled. However, the sampling of the signal from transmitter circuit 310 and the signal from transmitter circuit 311 are not being sampled by the same one of stacked sampler circuit 330 and stacked sampler circuit 340. In other words, during any given phase of CK (or CKN) the signals from both transmitter circuit 310 and transmitter circuit 311 are being sampled by a different one of stacked sampler circuit 330 and stacked sampler circuit 340, respectively. The operation of communication system 300 is further illustrated with reference to the timing diagram of FIG. 4.

Figure 4:
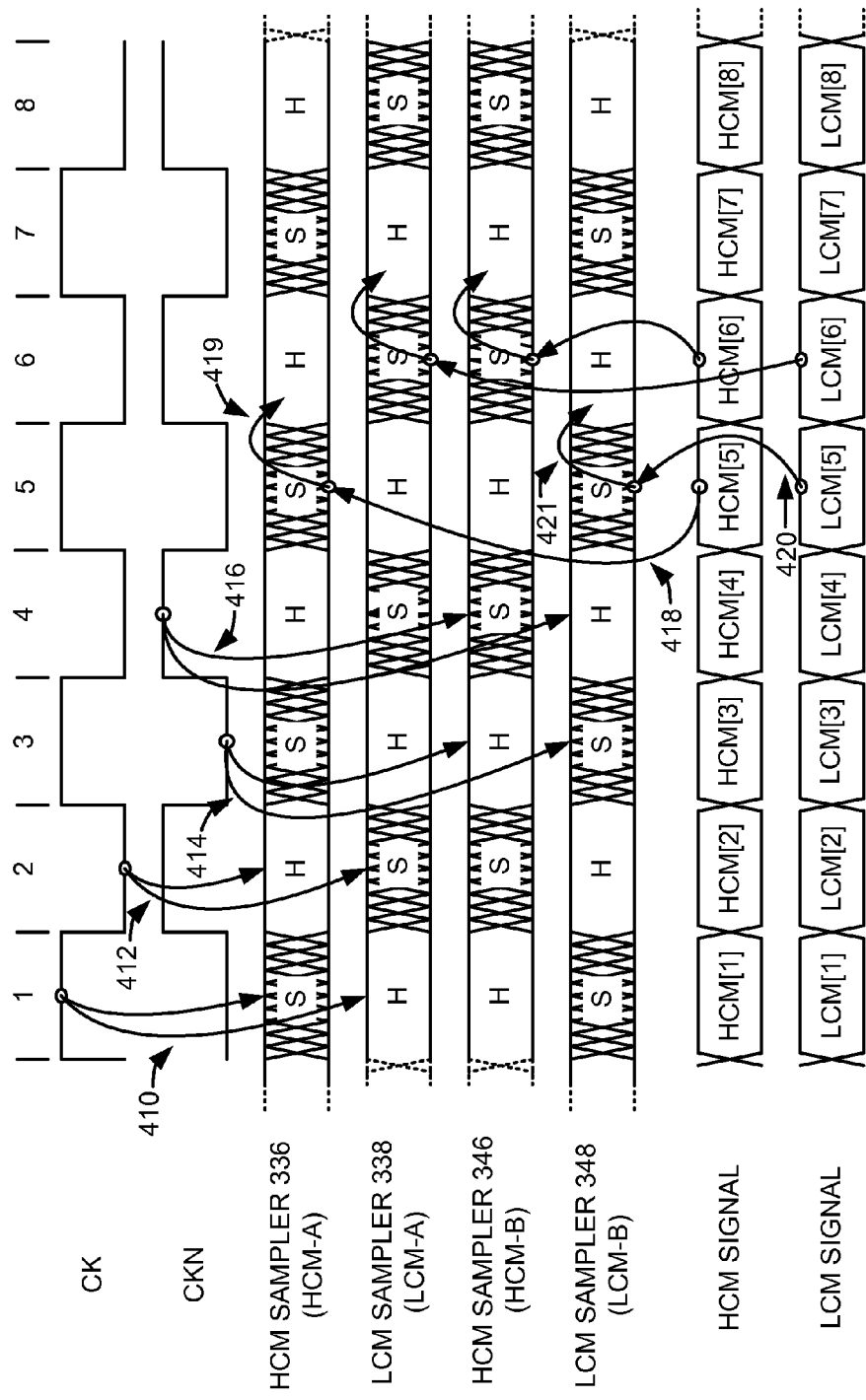
FIG. 4 is a timing diagram illustrating the operation of multi-phase stacked samplers.

FIG. 4 is a timing diagram illustrating the operation of multi-phase stacked samplers. In FIG. 4, CK is shown (starting with a logic high state) periodically toggling between a logic high ("1") and a logic low ("0"). CKN is shown as the complement of CK. Each phase of CK in FIG. 4 is labeled consecutively, starting with phase 1.

As discussed previously, when CK is high, the HCM sampler 336 of stacked sampler circuit 330 is sampling and the LCM sampler 338 of stacked sampler circuit 330 is holding. This is illustrated in FIG. 4 by arrows 410 from the high state of CK in phase 1 to the outputs of HCM sampler 336 and LCM sampler 338. In phase 1, the outputs of HCM sampler 336 and LCM sampler 338 are shown as being sampled ("S") and held ("H"), respectively.

When CK is low, the HCM sampler 336 of stacked sampler circuit 330 is holding and the LCM sampler 338 of stacked sampler circuit 330 is sampling. This is illustrated in FIG. 4 by arrows 412 from the low state of CK in phase 2 to the outputs of HCM sampler 336 and LCM sampler 338. In phase 2, the outputs of HCM sampler 336 and LCM sampler 338 are shown as being held and sampled, respectively.

When CKN is low, the HCM sampler 346 of stacked sampler circuit 340 is holding and the LCM sampler 348 of stacked sampler circuit 340 is sampling. This is illustrated in FIG. 4 by arrows 414 from the low state of CKN in phase 3 to the outputs of HCM sampler 346 and LCM sampler 348. In phase 3, the outputs of HCM sampler 346 and LCM sampler 348 are shown as being held and sampled, respectively.

When CKN is high, the HCM sampler 346 of stacked sampler circuit 340 is sampling and the LCM sampler 348 of stacked sampler circuit 340 is holding. This is illustrated in FIG. 4 by arrows 416 from the high state of CKN in phase 4 to the outputs of HCM sampler 346 and LCM sampler 348. In phase 4, the outputs of HCM sampler 346 and LCM sampler 348 are shown as being sampled and held, respectively.

While the LCM sampler 338 and HCM sampler are holding values, HCM sampler 336 of stacked sampler circuit 330 is sampling the HCM signal from transmitter 310 and LCM sampler 348 of stacked sampler circuit 340 is sampling the LCM signal from transmitter 310. This is illustrated in FIG. 4 by arrow 418 from the HCM input signal in phase 5 to the output of HCM sampler 336 in phase 5, and the arrow 420 from the LCM input signal in phase 5 to the output of LCM sampler 348.

When CK (and CKN) change state from phase 5 to phase 6, HCM sampler 336 holds the value it sampled in phase 5. This is shown by arrow 419 from the sampling state of HCM-A in phase 5 to the hold state of HCM-A in phase 6. The logic value output by HCM sampler 336 during its hold state in phase 6 corresponds to the HCM signal from transmitter 310 in phase 5 (HCM[5]). Likewise, when CK (and CKN) change state from phase 5 to phase 6, LCM sampler 348 holds the value it sampled in phase 5. This is shown by arrow 421 from the sampling state of LCM-B in phase 5 to the hold state of LCM-B in phase 6. The logic value output by LCM sampler 348 during its hold state in phase 6 corresponds to the LCM signal from transmitter 311 in phase 5 (LCM[5]). A similar process occurs when CK (and CKN) change state from phase 6 to phase 7 thereby causing HCM sampler 348 and LCM sampler 336 to sample and hold the values driven during phase 6 by transmitter 311 and transmitter 310, respectively.

Figure 5:
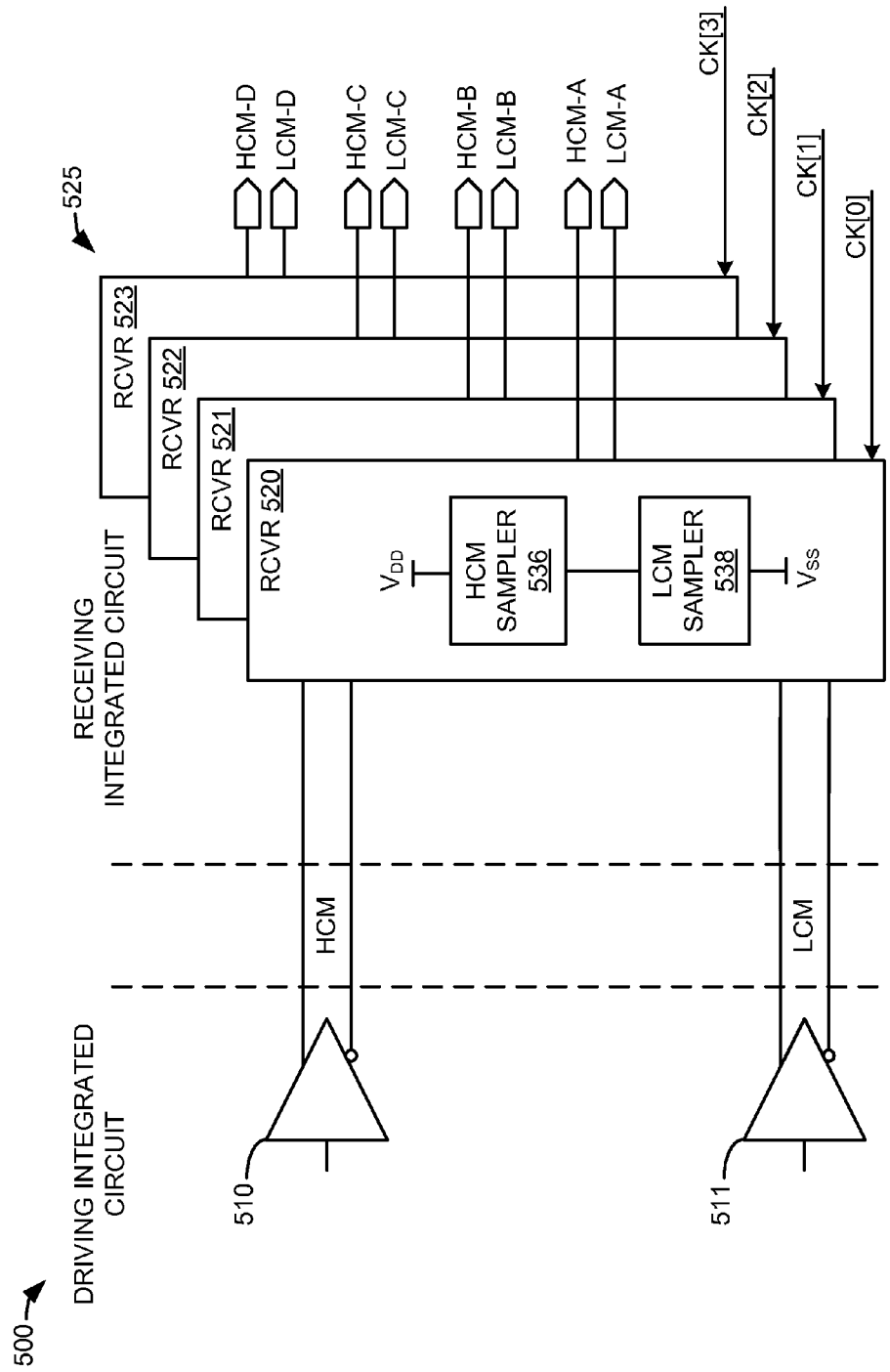
FIG. 5 is a block diagram illustrating a communication system with four-phase stacked samplers.

FIG. 5 is a block diagram illustrating a communication system 500 with four-phase stacked samplers. In FIG. 5, communication system 500 comprises a transmitter circuit 510, a transmitter circuit 511 and receivers 525. Receivers 525 comprise a receiver 520, a receiver 521, a receiver 522 and a receiver 523. Each of receivers 525 includes an HCM sampler 536 and an LCM sampler 538. Each of receivers 520-523 receives a different clock signal CK[0]-CK[3], respectively. Each of receivers 520-523 produces an output corresponding to the high common-mode signal sent by transmitter 510 (HCM-A through HCM-D, respectively). Each of receivers 520-523 produces an output corresponding to the low common-mode signal sent by transmitter 511 (LCM-A through LCM-D, respectively).

In each of receivers 525, the positive supply terminal of each HCM sampler 536 is connected to a positive power supply, $V_{DD}$, of the receiving integrated circuit. The negative power supply terminal of each HCM sampler 536 in each of receivers 520-523 is connected to an intermediate node of its respective receiver 520-523. The positive supply terminal of each LCM sampler 538 is connected to the intermediate node of its respective receiver 520-523. The negative power supply terminal of each LCM sampler 538 is connected to a negative power supply, $V_{SS}$, of the receiving integrated circuit.

Receivers 525 are illustrated in FIG. 5 as two-sampler (i.e., HCM sampler 536 and LCM sampler 538) stacks. It should be understood, however, that receivers 525 may have more than two samplers stacked. A multi-sampler stack may have more than two samplers with their power supply terminals connected in series. Thus, all but the sampler connected to the positive supply receive their positive supply voltage from another sampler in the stack.

As illustrated in FIG. 5, transmitter circuits 510-511 would typically be included on an integrated circuit that is driving signals. Receivers 525 would typically be part of an integrated circuit that is receiving signals. It should be understood that the signals driven from transmitter circuit 510 and transmitter circuit 511 to stacked receivers 525 of the receiving integrated circuit may be single-ended signals driven on a single conductor (not shown in FIG. 5) or differential signals driven on at least two conductors (as shown in FIG. 5).

In FIG. 5, the driving integrated circuit is illustrated with transmitter circuit 510 and transmitter circuit 511. In an embodiment, transmitter circuit 510 drives an HCM signal and transmitter circuit 311 drives an LCM signal.

In FIG. 5, transmitter circuit 510 and transmitter circuit 511 are not illustrated as a transmitter stack. That is because transmitter stacking is not necessary to convey signals to be received by receivers 525. However, it should be understood that transmitter circuit 510 and transmitter circuit 511 may be stacked. Also, two transmitter circuits are illustrated in FIG. 5. It should be understood, however, that more than two transmitters, each with appropriate common-mode voltages may drive signals to the receiving integrated circuit. To receive these signals, more than two samplers per receiver 520-523, each designed to resolve signals with an appropriate common-mode voltage at their input, may be provided.

In an embodiment, each receiver 520-523 receives a different timing reference signal (i.e., clock signal) CK[0]-CK[3], respectively. Each timing reference signal CK[0]-CK[3] is coupled to an active high clock input of each HCM sampler 536 such that the respective HCM sampler 536 will sample the signal received from transmitter circuit 510 in response to the transition of its respective timing reference signal CK[0]-CK[3] from low to high. Each timing reference signal CK[0]-CK[3] is also coupled to an active low clock input of each LCM sampler 538 such that the respective LCM sampler 538 will sample the signal received from transmitter circuit 511 in response to the transition of its respective timing reference signal CK[0]-CK[3] from high to low.

In an embodiment, CK[0] and CK[2] are complements of each other and CK[1] and CK[3] are complements of each other. Accordingly, when CK[0] transitions from low to high causing HCM sampler 536 of receiver 520 to sample the HCM signal from transmitter 510, CK[2] transitions from high to low causing LCM sampler 538 of receiver 522 to sample the LCM signal from transmitter 511. Likewise, when CK[1] transitions from low to high causing HCM sampler 536 of receiver 521 to sample the HCM signal from transmitter 510, CK[3] transitions from high to low causing LCM sampler 538 of receiver 523 to sample the LCM signal from transmitter 511. When CK[0] transitions from high to low causing LCM sampler 538 of receiver 520 to sample the LCM signal from transmitter 511, CK[2] transitions from low to high causing HCM sampler 536 of receiver 522 to sample the HCM signal from transmitter 510. When CK[1] transitions from high to low causing LCM sampler 538 of receiver 521 to sample the LCM signal from transmitter 511, CK[3] transitions from low to high causing HCM sampler 536 of receiver 523 to sample the HCM signal from transmitter 510. The operation of communication system 500 is further illustrated with reference to the timing diagram of FIG. 6.

Figure 6:
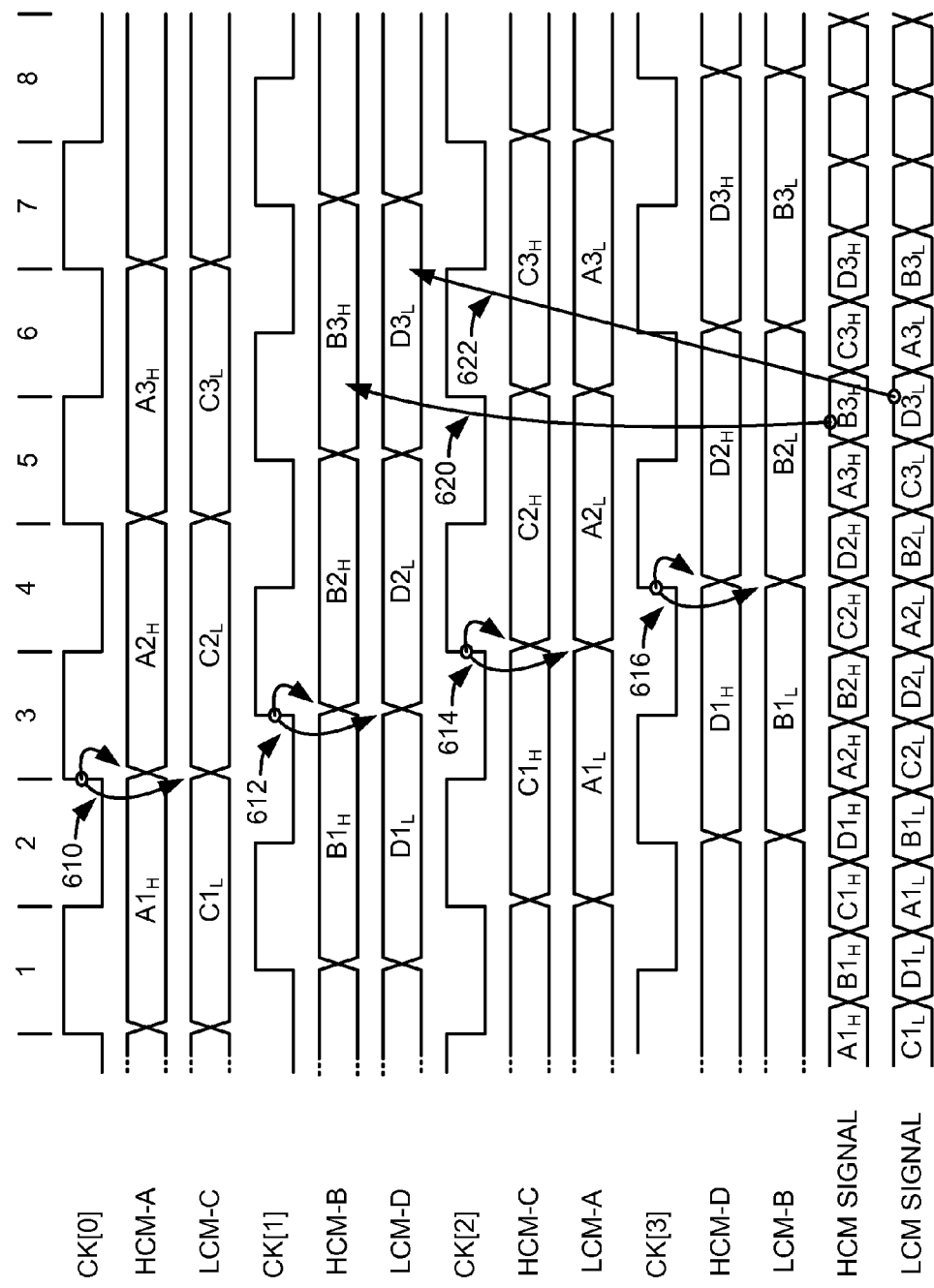
FIG. 6 is a timing diagram illustrating the operation of four-phase stacked samplers.

FIG. 6 is a timing diagram illustrating the operation of four-phase stacked samplers. In FIG. 6, CK[0] is shown (starting with a logic high state in phase 1) periodically toggling between a logic high ("1") and a logic low ("0"). CK[1] is shown as delayed from CK[0] by ¼ of a cycle (½ of a phase). CK[2] is the complement of CK[0] (or equivalently, delayed by ½ of a phase from CK[1]). CK[3] is the complement of CK[1] (or equivalently, delayed by ½ of a phase from CK[2] or ¾ of a cycle from CK[0]). Each phase of CK[0] in FIG. 6 is labeled consecutively, starting with phase 1.

As discussed previously, when CK[0] transitions from low to high (and CK[2] transitions from high to low), the HCM sampler 536 of receiver 520, and the LCM sampler 538 of receiver 522, sample. This is illustrated in FIG. 6 by arrows 610 from the low to high transition of CK[0] in between phases 2 and 3 to the transition on the outputs of HCM sampler 536 of receiver 520 (i.e., HCM-A) and LCM sampler 538 of receiver 522 (i.e., LCM-C). In response to the CK[0] transition from low to high (and CK[2] transition from high to low), HCM-A transitions from outputting $A1_H$ to $A2_H$ and LCM-C transitions from outputting $C1_L$ to outputting $C2_L$. $A2_H$ corresponds to the logic value received on the HCM input of receiver 520 from transmitter 510 when CK[0] transitioned from low to high. $C2_L$ corresponds to the logic value received on the LCM input of receiver 522 when CK[2] transitioned from high to low.

One-quarter of a cycle later, when CK[1] transitions from low to high (and CK[3] transitions from high to low), the HCM sampler 536 of receiver 521, and the LCM sampler 538 of receiver 523, sample. This is illustrated in FIG. 6 by arrows 612 from the low to high transition of CK[1] in the middle of phase 3 to the transition on the outputs of HCM sampler 536 of receiver 521 (i.e., HCM-B) and LCM sampler 538 of receiver 523 (i.e., LCM-D). In response to the CK[1] transition from low to high (and the CK[3] transition from high to low), HCM-B transitions from outputting $B1_H$ to $B2_H$ and LCM-D transitions from outputting $D1_L$ to outputting $D2_L$. $B2_H$ corresponds to the logic value received on the HCM input of receiver 521 when CK[1] transitioned from low to high. $D2_L$ corresponds to the logic value received on the LCM input of receiver 523 when CK[3] transitioned from high to low.

One-quarter of a cycle after CK[1] transitions from a low to a high during phase 3, CK[2] transitions from low to high (and CK[0] transitions from high to low), the HCM sampler 536 of receiver 522, and the LCM sampler 538 of receiver 520, sample. This is illustrated in FIG. 6 by arrows 614 from the low to high transition of CK[2] at the boundary between phase 3 and phase 4 to the transition on the outputs of HCM sampler 536 of receiver 522 (i.e., HCM-C) and LCM sampler 538 of receiver 520 (i.e., LCM-A). In response to the CK[2] transition from low to high (and the CK[0] transition from high to low), HCM-C transitions from outputting $C1_H$ to $C2_H$ and LCM-A transitions from outputting $A1_L$ to outputting $A2_L$. $C2_H$ corresponds to the logic value received on the HCM input of receiver 522 when CK[2] transitioned from low to high. $A2_L$ corresponds to the logic value received on the LCM input of receiver 520 when CK[0] transitioned from high to low.

One-quarter of a cycle after CK[2] transitions from a low to a high between phase 3 and phase 4, CK[3] transitions from low to high (and CK[1] transitions from high to low), the HCM sampler 536 of receiver 523, and the LCM sampler 538 of receiver 521, sample. This is illustrated in FIG. 6 by arrows 616 from the low to high transition of CK[3] in the middle of phase 4 to the transition on the outputs of HCM sampler 536 of receiver 523 (i.e., HCM-D) and LCM sampler 538 of receiver 521 (i.e., LCM-B). In response to the CK[3] transition from low to high (and the CK[1] transition from high to low), HCM-D transitions from outputting $D1_H$ to $D2_H$ and LCM-B transitions from outputting $B1_L$ to outputting $B2_L$. $D2_H$ corresponds to the logic value received on the HCM input of receiver 523 when CK[2] transitioned from low to high. $B2_L$ corresponds to the logic value received on the LCM input of receiver 521 when CK[1] transitioned from high to low.

As discussed previously, the values at the HCM and LCM inputs of receivers 525 are sampled in response to an transition of one or more of CK[0]-CK[3]. These sampled values are output by receivers 525. This is illustrated further in FIG. 6 by arrows 620 and 622 which run from HCM signal and LCM signal at the boundary of phase 5 and phase 6 to the corresponding value being output at HCM-B and LCM-D, respectively.

Figure 7:
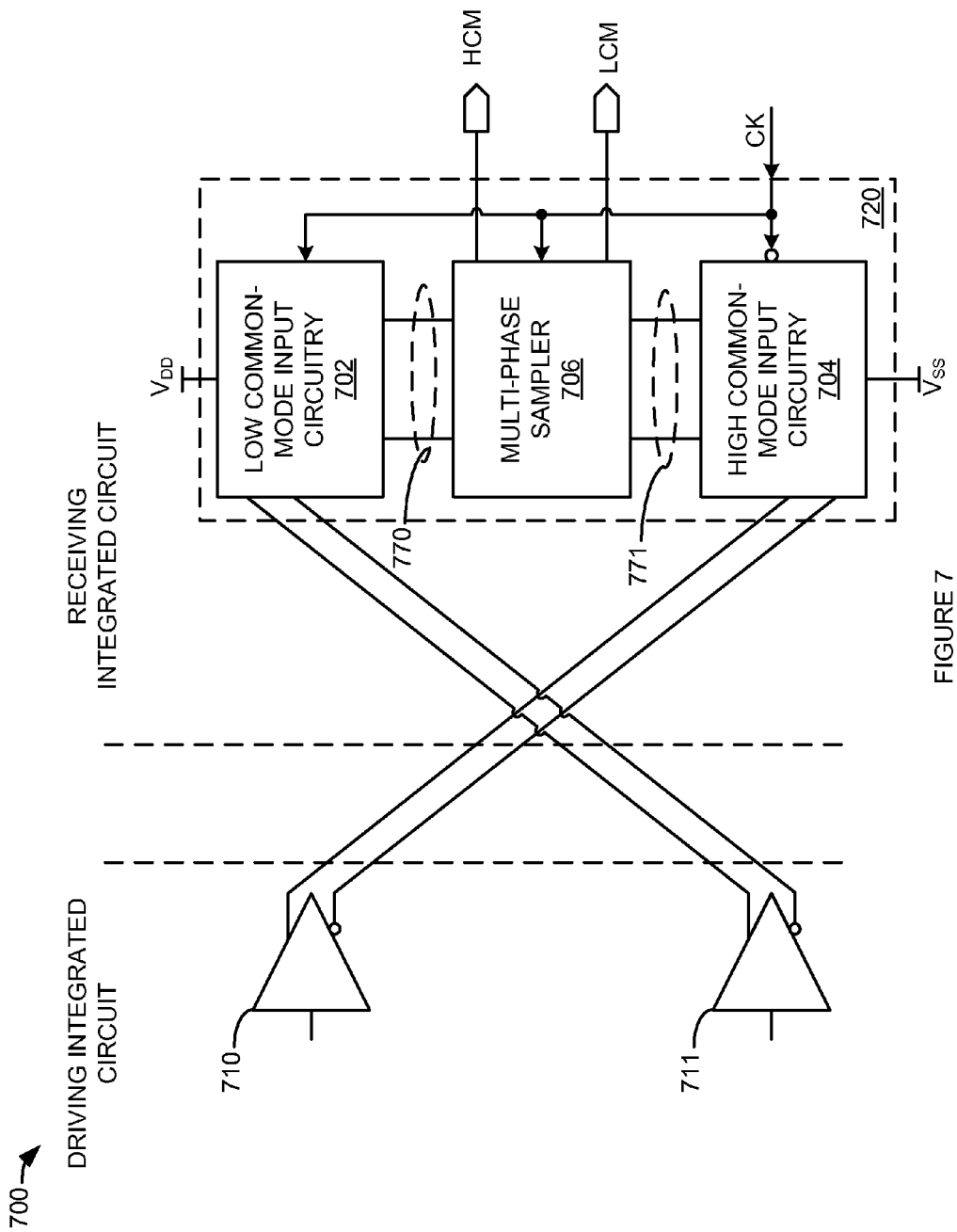
FIG. 7 is a block diagram illustrating a communication system with dual common-mode multi-phase stacked samplers.

FIG. 7 is a block diagram illustrating a communication system with dual common-mode multi-phase stacked samplers. In FIG. 7, communication system 700 comprises a transmitter circuit 710, a transmitter circuit 711, and a sampler circuit 720. Sampler circuit 720 comprises low common-mode input circuitry (LCM input circuitry) 702, high common-mode input circuitry (HCM input circuitry) 704, and a multi-phase sampler 706. The positive supply terminal of LCM input circuitry 702 is connected to a positive power supply, $V_{DD}$, of the receiving integrated circuit. A differential output 770 of LCM input circuitry 702 is connected to a multi-phase sampler 706 to supply both a differential output signal and power supply current to multi-phase sampler 706. A differential output 771 of HCM input circuitry 704 is connected to multi-phase sampler 706 to supply both a differential output signal and sink power supply current used by multi-phase sampler 706. Thus, multi-phase sampler 706 receives its positive power supply current from differential output 770 of LCM input circuitry 702 and sends its negative power supply current to the differential output 771 of HCM input circuitry 704. The negative power supply terminal of HCM input circuitry 704 is connected to a negative power supply, $V_{SS}$, of the receiving integrated circuit.

As illustrated in FIG. 7, transmitter circuits 710-711 are typically included on an integrated circuit that is driving signals. Sampler circuit 720 is typically part of an integrated circuit that is receiving signals. It should be understood that the signals driven from transmitter circuit 710 and transmitter circuit 711 to sampler circuit 720 of the receiving integrated circuit may be single-ended signals driven on a single conductor (not shown in FIG. 7) or differential signals driven on at least two conductors (as shown in FIG. 7).

In FIG. 7, the driving integrated circuit is illustrated with transmitter circuit 710 and transmitter circuit 711. In an embodiment, transmitter circuit 710 drives a high common-mode (HCM) signal and transmitter circuit 711 drives a low common-mode (LCM) signal.

In FIG. 7, transmitter circuit 710 and transmitter circuit 711 are not illustrated as a transmitter stack. That is because transmitter stacking is not necessary to convey signals to be received by sampler circuit 720. However, it should be understood that transmitter circuit 710 and transmitter circuit 711 may be stacked.

In an embodiment, sampler circuit 720 receives a timing reference signal (i.e., clock signal) CK. CK is coupled to a clock input of LCM input circuitry 702 such that LCM input circuitry 702 will send on differential output 770 a differential signal that corresponds to the signal received from transmitter circuit 711 when CK is low. When CK is high, LCM input circuitry 702 will send a signal with a zero differential (i.e., both terminals of differential output 770 at the same voltage) on differential output 770. CK is coupled to a clock input of HCM input circuitry 704 such that HCM input circuitry 704 will pull on differential output 771 a differential signal that corresponds to the signal received from transmitter circuit 710 when CK is high. When CK is low, HCM input circuitry 704 will pull a signal with a zero differential (i.e., both terminals of differential output 771 at the same voltage) on differential output 771.

Multi-phase sampler 706 also receives timing reference signal CK. CK is coupled to multi-phase sampler 706 such that multi-phase sampler 706 will sample the signal received from LCM input circuitry 702 when CK is low, and will hold the resolved logic value on its LCM output terminal when CK is high. CK is also coupled to multi-phase sampler 706 such that multi-phase sampler 706 will sample the signal received from HCM input circuitry 704 when CK is high, and will hold the resolved logic value on its HCM output terminal when CK is low.

In other words, when CK is low, LCM input circuitry 702 sends a differential signal on differential output 770 that corresponds to the signal received from transmitter circuit 711. At the same time, because CK is low, HCM input circuitry 704 pulls a signal with a zero differential on differential output 771. Because there is a zero differential on differential output 771, the conductors of differential output 771 are effectively the negative power supply voltage for multi-phase sampler 706, and not an input. When CK is high, LCM input circuitry 702 sends a signal with a zero differential on differential output 770. At the same time, because CK is high, HCM input circuitry 704 pulls a differential signal that corresponds to the signal received from transmitter circuit 710. Because there is a zero differential on differential output 770, the conductors of differential output 770 are effectively the positive power supply voltage for multi-phase sampler 706, and not an input.

Figure 8:
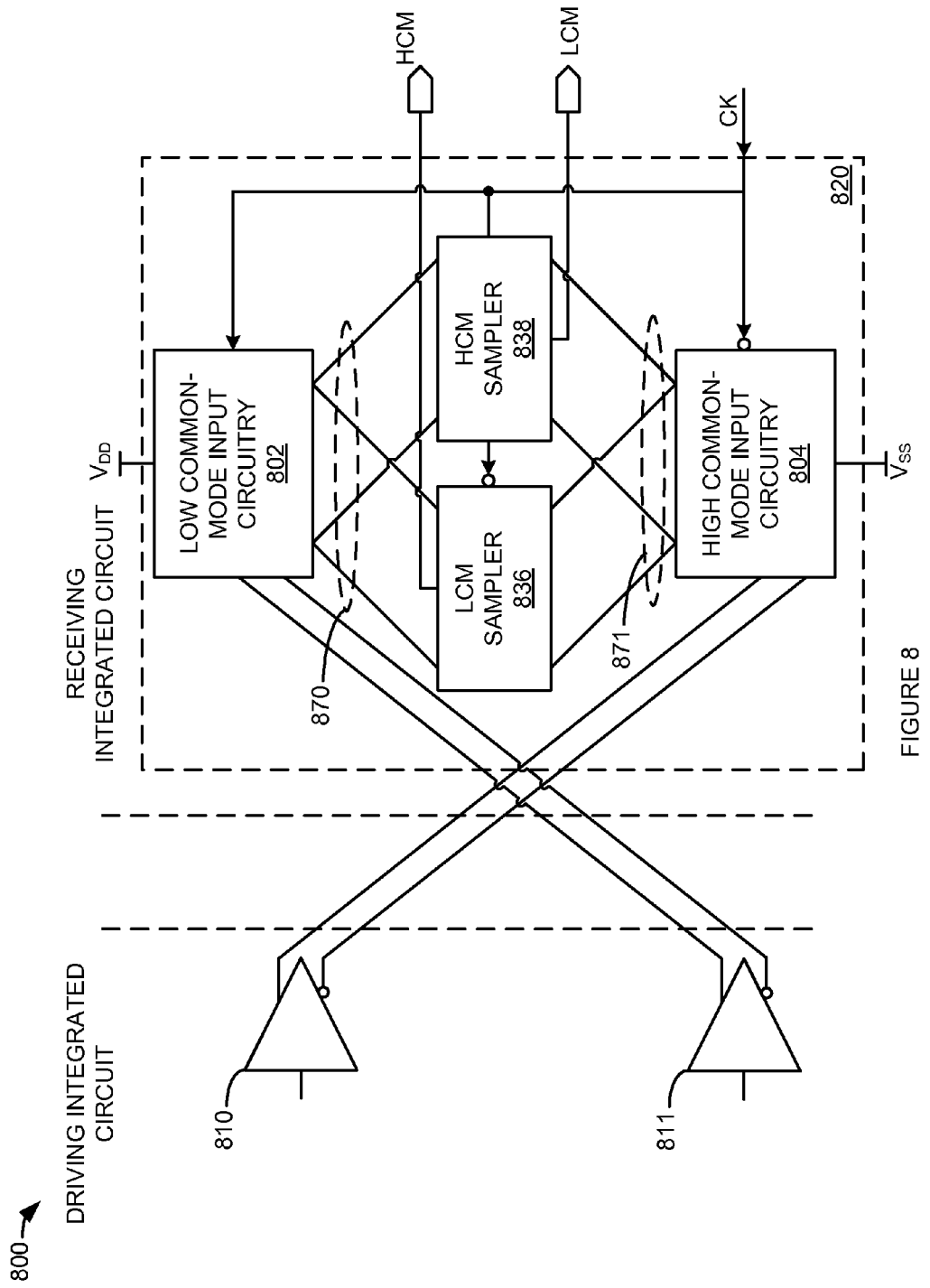
FIG. 8 is a block diagram illustrating a communication system with dual common-mode multi-phase stacked samplers.

FIG. 8 is a block diagram illustrating a communication system 800 with dual common-mode multi-phase stacked samplers. In FIG. 8, communication system 800 comprises a transmitter circuit 810, a transmitter circuit 811, and a sampler circuit 820. Sampler circuit 820 comprises low common-mode input circuitry (LCM input circuitry) 802, high common-mode input circuitry (HCM input circuitry) 804, a HCM sampler 836, and a LCM sampler 838.

The positive supply terminal of LCM input circuitry 802 is connected to a positive power supply, $V_{DD}$, of the receiving integrated circuit. A differential output 870 of LCM input circuitry 802 is connected to LCM sampler 836 and HCM sampler 838. LCM input circuitry 802 is connected to LCM sampler 836 to supply LCM sampler 836 with a differential signal corresponding to the signal LCM input circuitry 802 is receiving from transmitter 811. LCM input circuitry 802 is connected to HCM sampler 838 to supply HCM sampler 838 with a power supply current. A differential output 871 of HCM input circuitry 804 is connected to LCM sampler 836 and HCM sampler 838. A differential output 871 of HCM input circuitry 804 is connected to HCM sampler 838 to supply HCM sampler 838 with a differential signal corresponding to the signal HCM input circuitry 804 is receiving from transmitter 810. HCM input circuitry 804 is connected to LCM sampler 836 to provide LCM sampler 836 with a power supply current sink. The negative power supply terminal of HCM input circuitry 804 is connected to a negative power supply, $V_{SS}$, of the receiving integrated circuit.

As illustrated in FIG. 8, transmitter circuits 810-811 are typically included on an integrated circuit that is driving signals. Sampler circuit 820 is typically part of an integrated circuit that is receiving signals. It should be understood that the signals driven from transmitter circuit 810 and transmitter circuit 811 to sampler circuit 820 of the receiving integrated circuit may be single-ended signals driven on a single conductor (not shown in FIG. 8) or differential signals driven on at least two conductors (as shown in FIG. 8).

In FIG. 8, the driving integrated circuit is illustrated with transmitter circuit 810 and transmitter circuit 811. In an embodiment, transmitter circuit 810 drives a high common-mode (HCM) signal and transmitter circuit 811 drives a low common-mode (LCM) signal.

In FIG. 8, transmitter circuit 810 and transmitter circuit 811 are not illustrated as a transmitter stack. That is because transmitter stacking is not necessary to convey signals to be received by sampler circuit 820. However, it should be understood that transmitter circuit 810 and transmitter circuit 811 may be stacked.

In an embodiment, sampler circuit 820 receives a timing reference signal (i.e., clock signal) CK. CK is coupled to a clock input of LCM input circuitry 802 such that LCM input circuitry 802 will send a differential signal on differential output 870 that corresponds to the signal received from transmitter circuit 811 when CK is low, and send a signal with a zero differential (i.e., both terminals of differential output 870 at the same voltage) on differential output 870 when CK is high. CK is coupled to a clock input of HCM input circuitry 804 such that HCM input circuitry 804 will pull a differential signal on differential output 871 that corresponds to the signal received from transmitter circuit 810 when CK is high, and pull a signal with a zero differential (i.e., both terminals of differential output 871 at the same voltage) on differential output 871 when CK is low.

LCM sampler 836 and HCM sampler 838 also receive timing reference signal CK. CK is coupled to LCM sampler 836 such that LCM sampler 836 will sample the signal received from LCM input circuitry 802 when CK is low.

When CK is high, LCM sampler 836 isolates itself from differential output 870 and differential output 871. CK is coupled to HCM sampler 838 such that HCM sampler 838 will sample the signal received from HCM input circuitry 804 when CK is high. When CK is low, HCM sampler 838 isolates itself from differential output 870 and differential output 871.

In other words, when CK is low, LCM input circuitry 802 sends a differential signal that corresponds to the signal received from transmitter circuit 811 on differential output 870 to LCM sampler 836 (which is active and sampling). At the same time, HCM sampler 838 is isolated from both LCM input circuitry 802 and HCM input circuitry 804. Also at the same time, HCM input circuitry 804 is acting as an effective negative power supply to LCM sampler 836 because HCM input circuitry 804 is pulling a signal with a zero differential (i.e., both terminals of differential output 871 at the same voltage) on differential output 871.

When CK is high, HCM input circuitry 804 pulls a differential signal that corresponds to the signal received from transmitter circuit 810 on differential output 871 from HCM sampler 838 (which is active and sampling). At the same time, LCM sampler 836 is isolated from both LCM input circuitry 802 and HCM input circuitry 804. Also at the same time, LCM input circuitry 802 is acting as an effective positive power supply to HCM sampler 838 because LCM input circuitry 802 is sending a signal with a zero differential (i.e., both terminals of differential output 870 at the same voltage) on differential output 870.

Figure 9:
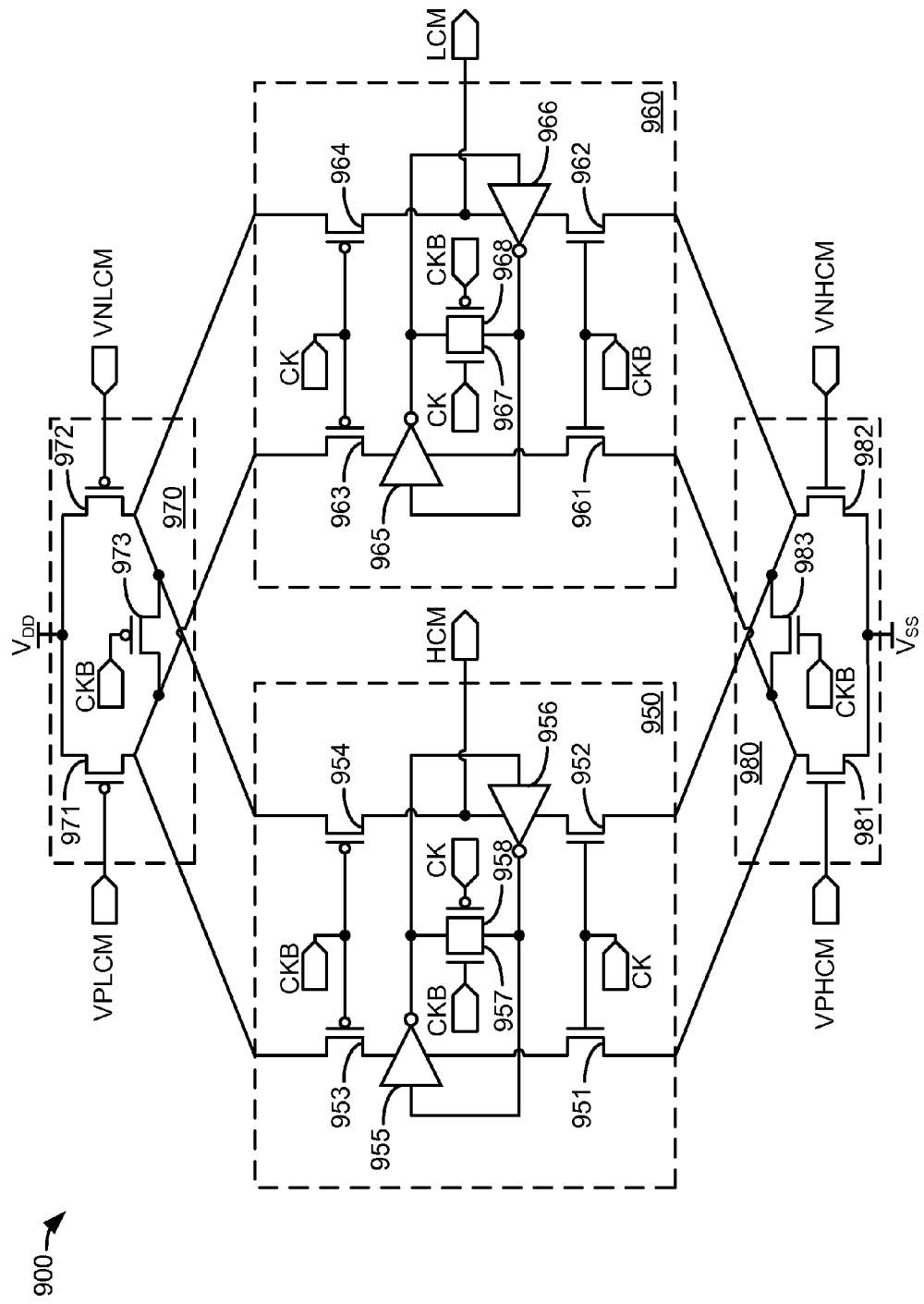
FIG. 9 is a schematic diagram illustrating a dual common-mode two-phase stacked sampler.

FIG. 9 is a schematic diagram illustrating a dual common-mode two-phase stacked sampler 900. In FIG. 9, sampler 900 comprises: LCM input circuitry 970, HCM input circuitry 980, a HCM sampler 950, and a LCM sampler 960. LCM input circuitry 970 comprises p-channel field effect transistors (PFETs) 971-973. LCM input circuitry 970 may correspond to LCM input circuitry 702 or 802, discussed previously. HCM input circuitry 980 comprises NFETs 981-983. HCM input circuitry 980 may correspond to HCM input circuitry 704 or 804, discussed previously. HCM sampler 950 comprises a NFET 951, a NFET 952, a PFET 953, a PFET 954, an inverter 955, an inverter 956, a NFET 957, and a PFET 958. LCM sampler 960 comprises a NFET 961, a NFET 962, a PFET 963, a PFET 964, an inverter 965, an inverter 966, a NFET 967, and a PFET 968. NFET 957 and PFET 958, NFET 967 and PFET 968, PFET 973, and NFET 983 are configured as pass-gates. Thus, because the source and drain terminals of FETs that are configured as pass gates are interchangeable, these terminals of NFET 957, PFET 958, NFET 967, PFET 968, PFET 973, and NFET 983 will be referred to hereafter as first channel terminal and second channel terminal.

The gate of PFET 971 receives a signal VPLCM, one-half of a low common-mode differential signal pair. The gate of PFET 972 receives a signal VNLCM, the other half of the low common-mode differential signal pair. The gate of PFET 973 is connected to CKB. The sources of PFETs 971 and 972 are connected to a positive power supply, $V_{DD}$. The drain of PFET 971 is connected to the source of PFET 953 and the source of PFET 963. The drain of PFET 971 is also connected to the first channel terminal of PFET 973. The drain of PFET 972 is connected to the source of PFET 954 and the source of PFET 964. The drain of PFET 972 is also connected to the second channel terminal of PFET 973. The drains of PFETs 971 and 972 may correspond to differential output 870, discussed previously.

The gate of NFET 981 receives a signal VPHCM, one-half of a high common-mode differential signal pair. The gate of NFET 982 receives a signal VNHCM, the other half of the high common-mode differential signal pair. The gate of NFET 983 is connected to CKB. The sources of NFETs 981 and 982 are connected to a negative power supply, $V_{SS}$. The drain of NFET 981 is connected to the source of NFET 951 and the source of NFET 961. The drain of NFET 981 is also connected to the first channel terminal of NFET 983. The drain of NFET 982 is connected to the source of NFET 952 and the source of NFET 962. The drain of NFET 982 is also connected to the second channel terminal of NFET 983. The drains of NFETs 981 and 982 may correspond to differential output 871, discussed previously.

The source of NFET 951 is connected to the drain of NFET 981. The source of NFET 952 is connected to the drain of NFET 982. The drain of NFET 951 is connected to the negative power supply terminal of inverter 955. The drain of NFET 952 is connected to the negative power supply terminal of inverter 956. The source of PFET 953 is connected to the drain of PFET 971. The source of PFET 954 is connected to the drain of PFET 972. The drain of PFET 953 is connected to the positive power supply terminal of inverter 955. The drain of PFET 954 is connected to the positive power supply terminal of inverter 956. The drain of PFET 954 is an output of HCM sampler 950, HCM. The first channel terminal of NFET 957/PFET 958 is connected to the output of inverter 955. The second channel terminal of NFET 957/PFET 958 is connected to the output of inverter 956. The output of inverter 955 is also connected to the input of inverter 956. The output of inverter 956 is also connected to the input of inverter 955.

The gates of NFETs 951 and 952 are connected to CK. The gates of PFETs 953 and 954 are connected to CKB. The gate of NFET 957 is connected to CKB. The gate of PFET 958 is connected to CK. It should be understood that when CK is high and CKB is low, NFET 951, NFET 952, PFET 953, and PFET 954 are all on thereby enabling inverter 955 and inverter 956 to operate normally. However, when CK is low and CKB is high, NFET 951, NFET 952, PFET 953, and PFET 954 are all off thereby effectively placing the output of inverter 955 and the output of inverter 956 in a high-impedance state (i.e., tri-stated). Accordingly, the signal on the positive power supply terminals of inverters 955 and 956 may be viewed as a positive enable signals to that respective (tri-state able) inverter. The signal on the negative power supply terminals of inverter 955 and inverter 956 may be viewed as negative enable signal to that respective (tri-state able) inverter.

The source of NFET 961 is connected to the drain of NFET 981. The source of NFET 962 is connected to the drain of NFET 982. The drain of NFET 961 is connected to the negative power supply terminal of inverter 965. The drain of NFET 962 is connected to the negative power supply terminal of inverter 966. The source of PFET 963 is connected to the drain of PFET 971. The source of PFET 964 is connected to the drain of PFET 972. The drain of PFET 963 is connected to the positive power supply terminal of inverter 965. The drain of PFET 964 is connected to the positive power supply terminal of inverter 966. The drain of PFET 964 is an output of LCM sampler 960, LCM. The first channel terminal of NFET 967/PFET 968 is connected to the output of inverter 965. The second channel terminal of NFET 967/PFET 968 is connected to the output of inverter 966. The output of inverter 965 is also connected to the input of inverter 966. The output of inverter 966 is also connected to the input of inverter 965.

The gates of NFETs 961 and 962 are connected to CKB. The gates of PFETs 963 and 964 are connected to CK. The gate of NFET 967 is connected to CK. The gate of PFET 968 is connected to CKB. It should be understood that when CK is low and CKB is high, NFET 961, NFET 962, PFET 963, and PFET 964 are all on thereby enabling inverter 965 and inverter 966 to operate normally. However, when CK is high and CKB is low, NFET 961, NFET 962, PFET 963, and PFET 964 are all off thereby effectively placing the output of inverter 965 and the output of inverter 966 in a high-impedance state (i.e., tri-stated). Accordingly, the signal on the positive power supply terminals of inverters 965 and 966 may be viewed as a positive enable signals to that respective (tri-state able) inverter. The signal on the negative power supply terminals of inverter 965 and inverter 966 may be viewed as negative enable signal to that respective (tri-state able) inverter.

Signals CK and CKB are complements of each other. Thus it can be seen from FIG. 9 that when CK is high (and thus CKB is low): (1) the outputs of LCM input circuitry 970 have no voltage differential because PFET 973 is on, thereby equalizing the voltage on the drains of PFETs 971 and 972, which effectively makes the drain of PFETs 971 and 972 a positive power supply for HCM sampler 950; (2) NFETs 961 and 962 are off, isolating LCM sampler 960 from HCM input circuitry 980; (3) PFETs 963 and 964 are off, isolating LCM sampler 960 from LCM input circuitry 970; and, (4) NFET 967 and PFET 968 are on, thereby equalizing the voltages on the inputs and outputs of inverters 965 and 966.

Also when CK is high: (A) NFETs 951-952 are on, thereby connecting HCM sampler 950 to receive a differential signal from HCM input circuitry 980; (B) PFETs 953-954 are on, thereby allowing LCM input circuitry 970 to effectively provide a positive power supply to HCM sampler 950; and, (C) NFET 957 and PFET 958 are off, thereby allowing the voltage differential received from HCM input circuitry 980 to be amplified and latched by the feedback effect that cross-coupled inverters 955 and 956 have on each other, in order to produce the output signal of HCM sampler 950, HCM. Thus, the voltage differential received from HCM input circuitry 980 is converted to the output signal HCM.

When CK is low (and thus CKB is high): (1) the outputs of HCM input circuitry 980 have no voltage differential because NFET 983 is on, thereby equalizing the voltage on the drains of NFETs 981 and 982, which effectively makes the drains of NFETs 981 and 982 a negative power supply for LCM sampler 960; (2) PFETs 953 and 954 are off, isolating HCM sampler 950 from LCM input circuitry 970; (3) NFETs 951 and 952 are off, isolating HCM sampler from HCM input circuitry 980; and, (4) NFET 957 and PFET 958 are on, thereby equalizing the voltages on the inputs and outputs of inverters 955 and 956.

Also when CK is low: (A) PFETs 963-964 are on, thereby connecting LCM sampler 960 to receive a differential signal from LCM input circuitry 970; (B) NFETs 961-962 are on, thereby allowing HCM input circuitry 980 to effectively provide a negative power supply to LCM sampler 960; and, (C) NFET 967 and PFET 968 are off, thereby allowing the voltage differential received from LCM input circuitry 970 to be amplified and latched by the feedback effect that cross-coupled inverters 965 and 966 have on each other, in order to produce the output signal of LCM sampler 960, LCM. Thus, the voltage differential received from LCM input circuitry 970 is converted to the output signal LCM.

Figure 10:
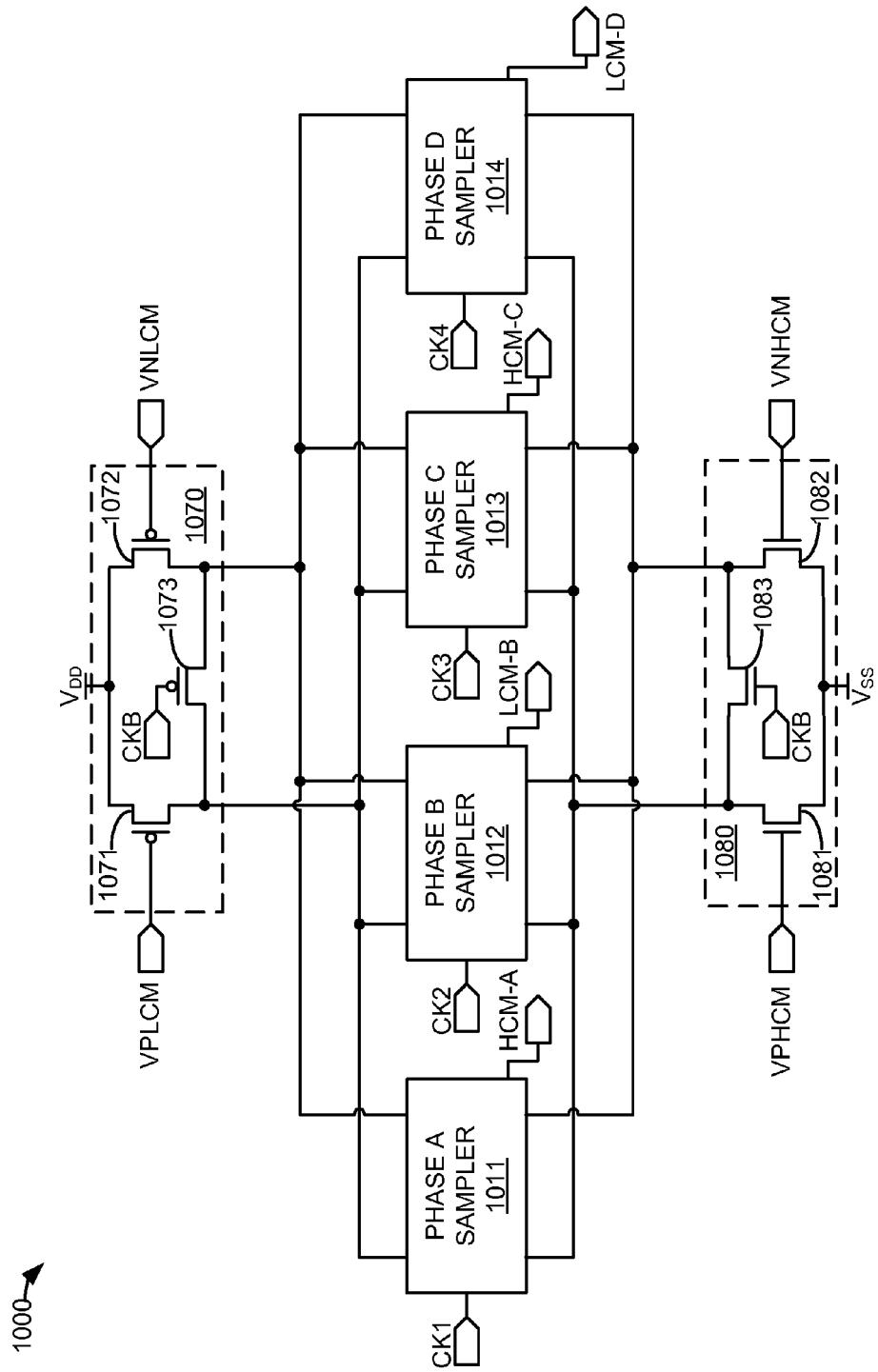
FIG. 10 is a block diagram illustrating a dual common-mode four-phase stacked sampler.

FIG. 10 is a block diagram illustrating a dual common-mode four-phase stacked sampler 1000. In FIG. 10, sampler 1000 comprises: LCM input circuitry 1070, HCM input circuitry 1080, a phase A sampler 1011, a phase B sampler 1012, a phase C sampler 1013, and a phase D sampler 1014. LCM input circuitry 1070 comprises PFETs 1071-1073. HCM input circuitry 1080 comprises NFETs 1081-1083.

Phase A sampler 1011, phase B sampler 1012, phase C sampler 1013, and phase D sampler 1014 can each be implemented using the same circuit as HCM sampler 950, except that each of phase A sampler 1011, phase B sampler 1012, phase C sampler 1013, and phase D sampler 1014 receives a different clock (CK1, CK2, CK3, and CK4, respectively) and its complement (not shown in FIG. 10). Thus, like HCM sampler 950, each of phase A sampler 1011, phase B sampler 1012, phase C sampler 1013, and phase D sampler 1014 sample when their respective clock signal is high. The outputs of phase A sampler 1011, phase B sampler 1012, phase C sampler 1013, and phase D sampler 1014 are HCM-A, LCM-B, HCM-C, and LCM-D, respectively. Also like HCM sampler 950, the inputs from LCM input circuitry 1070 received by phase A sampler 1011, phase B sampler 1012, phase C sampler 1013, and phase D sampler 1014 are connected to the sources of the PFETs of phase A sampler 1011, phase B sampler 1012, phase C sampler 1013, and phase D sampler 1014 that correspond to PFETs 953 and 954 of HCM sampler 950. The inputs from HCM input circuitry 1080 received by phase A sampler 1011, phase B sampler 1012, phase C sampler 1013, and phase D sampler 1014 are connected to the sources of the NFETs of phase A sampler 1011, phase B sampler 1012, phase C sampler 1013, and phase D sampler 1014 that correspond to NFETs 951 and 952 of HCM sampler 950.

The gate of PFET 1071 receives a signal VPLCM, one-half of a low common-mode differential signal pair. The gate of PFET 1072 receives a signal VNLCM, the other half of the low common-mode differential signal pair. The gate of PFET 1073 is connected to CKB. The sources of PFETs 1071 and 1072 are connected to a positive power supply, $V_{DD}$. The drain of PFET 1071 is connected to a first LCM input circuitry input of each of phase A sampler 1011, phase B sampler 1012, phase C sampler 1013, and phase D sampler 1014. The drain of PFET 1071 is also connected to the first channel terminal of PFET 1073. The drain of PFET 1072 is connected to a second LCM input circuitry input of each of phase A sampler 1011, phase B sampler 1012, phase C sampler 1013, and phase D sampler 1014. The drain of PFET 1072 is also connected to the second channel terminal of PFET 1073.

The gate of NFET 1081 receives a signal VPHCM, one-half of a high common-mode differential signal pair. The gate of NFET 1082 receives a signal VNHCM, the other half of the high common-mode differential signal pair. The gate of NFET 1083 is connected to CKB. The sources of NFETs 1081 and 1082 are connected to a negative power supply, $V_{SS}$. The drain of NFET 1081 is connected to a first HCM input circuitry input of each of phase A sampler 1011, phase B sampler 1012, phase C sampler 1013, and phase D sampler 1014. The drain of NFET 1081 is also connected to the first channel terminal of NFET 1083. The drain of NFET 1082 is connected to a second HCM input circuitry input of each of phase A sampler 1011, phase B sampler 1012, phase C sampler 1013, and phase D sampler 1014. The drain of NFET 1082 is also connected to the second channel terminal of NFET 1083.

Figure 11:
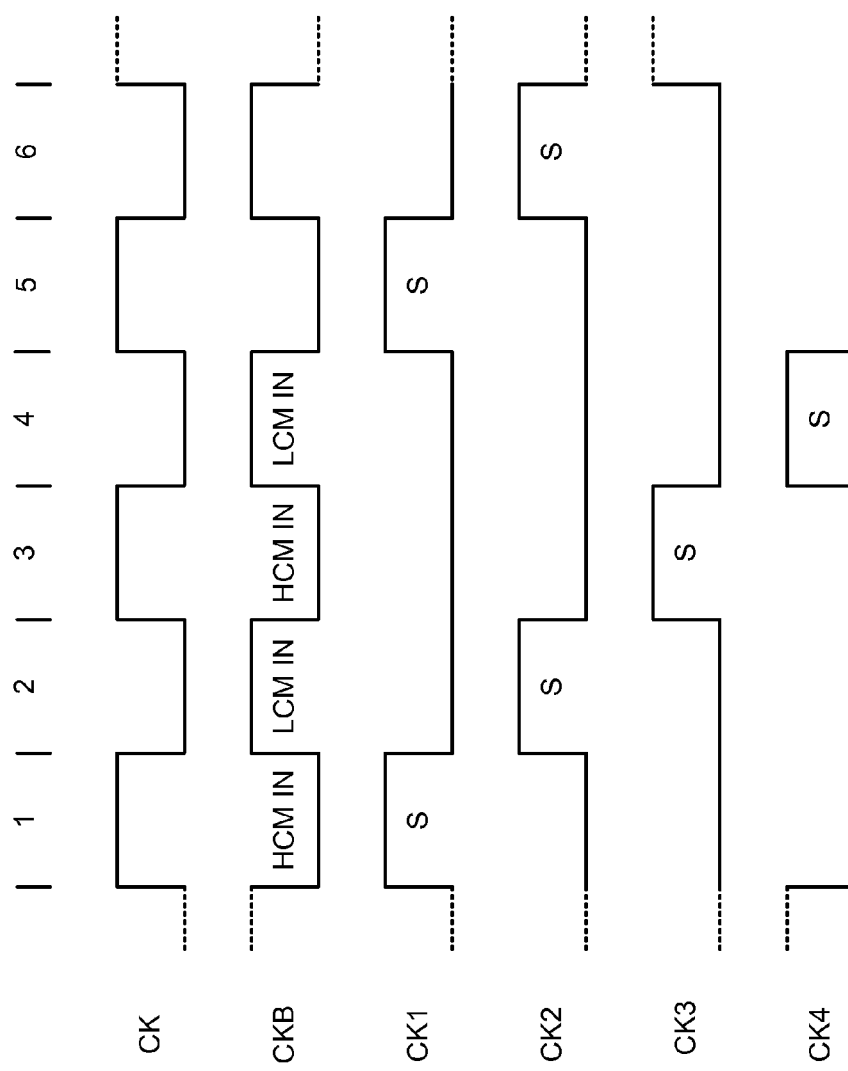
FIG. 11 is a timing diagram illustrating an example clocking scheme of a dual common-mode four-phase stacked sampler.

FIG. 11 is a timing diagram illustrating an example clocking scheme of a dual common-mode four-phase stacked sampler. The timings in FIG. 11 may be used to clock the elements of sampler 1000. In FIG. 11, CK is shown (starting with a logic high state) periodically toggling between a logic high ("1") and a logic low ("0"). CKN is shown as the complement of CK. Each phase of CK in FIG. 11 is labeled consecutively, starting with phase 1.

In phase 1, CK is high, CKB is low, CK1 is high, and CK2 through CK4 are low. Thus, the outputs of LCM input circuitry 1070 have no voltage differential because PFET 1073 is on, thereby equalizing the voltage on the drains of PFETs 1071 and 1072, which effectively makes the drains of PFETs 1071 and 1072 a positive power supply for phase A sampler 1011; (2) phase B sampler 1012, phase C sampler 1013, and phase D sampler 1014 are isolated from both LCM input circuitry 1070 and HCM input circuitry 1080; and, (3) phase A sampler 1011 is sampling the signals received from HCM input circuitry 1080 in order to produce the output signal of phase A sampler 1011, HCM-A. Thus, in phase 1, the differential signal received from HCM input circuitry 1080 is converted to the output signal HCM-A.

In phase 2, CK is low, CKB is high, CK1 is low, CK2 is high, and CK3 and CK4 are low. Thus, the outputs of HCM input circuitry 1080 have no voltage differential because NFET 1083 is on, thereby equalizing the voltage on the drains of NFETs 1081 and 1082, which effectively makes the drains of NFETs 1081 and 1082 a negative power supply for phase B sampler 1012; (2) phase A sampler 1011, phase C sampler 1013, and phase D sampler 1014 are isolated from both LCM input circuitry 1070 and HCM input circuitry 1080; and, (3) phase B sampler 1012 is sampling the signals received from LCM input circuitry 1070 in order to produce the output signal of phase B sampler 1012, LCM-B. Thus, in phase 2, the differential signal received from LCM input circuitry 1070 is converted to the output signal LCM-B.

In phase 3, CK is high, CKB is low, CK1, CK2, and CK4 are low, and CK3 is high. Thus, the outputs of LCM input circuitry 1070 have no voltage differential because PFET 1073 is on, thereby equalizing the voltage on the drains of PFETs 1071 and 1072, which effectively makes the drains of PFETs 1071 and 1072 a positive power supply for phase C sampler 1013; (2) phase A sampler 1011, phase B sampler 1012, and phase D sampler 1014 are isolated from both LCM input circuitry 1070 and HCM input circuitry 1080; and, (3) phase C sampler 1013 is sampling the signals received from HCM input circuitry 1080 in order to produce the output signal of phase C sampler 1013, HCM-C. Thus, in phase 3, the differential signal received from HCM input circuitry 1080 is converted to the output signal HCM-C.

Finally, in phase 4, CK is low, CKB is high, CK1, CK2, and CK3 are low, and CK4 is high. Thus, the outputs of HCM input circuitry 1080 have no voltage differential because NFET 1083 is on, thereby equalizing the voltage on the drains of NFETs 1081 and 1082, which effectively makes the drains of NFETs 1081 and 1082 a negative power supply for phase D sampler 1014; (2) phase A sampler 1011, phase B sampler 1012, and phase C sampler 1013 are isolated from both LCM input circuitry 1070 and HCM input circuitry 1080; and, (3) phase D sampler 1014 is sampling the signals received from LCM input circuitry 1070 in order to produce the output signal of phase D sampler 1014, LCM-D. Thus, in phase 4, the differential signal received from LCM input circuitry 1070 is converted to the output signal LCM-D.

The devices, circuits, systems and devices described above may be implemented in computer systems, or stored by computer systems. The systems described above may also be stored on a computer readable medium. Devices, circuits, and systems described herein may be implemented using computer-aided design tools available in the art, and embodied by computer-readable files containing software descriptions of such circuits. This includes, but is not limited to one or more elements of communication system 100, receiver system 200, communication system 300, communication system 500, communication system 700, communication system 800, sampler 900, and sampler 1000, their components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

FIG. 12 illustrates a block diagram of a computer system. Computer system 1200 includes communication interface 1220, processing system 1230, storage system 1240, and user interface 1260. Processing system 1230 is operatively coupled to storage system 1240. Storage system 1240 stores software 1250 and data 1270. Computer system 1200 may include communication system 100, receiver system 200, communication system 300, communication system 500, communication system 700, communication system 800, sampler 900, or sampler 1000—or their components. Processing system 1230 is operatively coupled to communication interface 1220 and user interface 1260. Computer system 1200 may comprise a programmed general-purpose computer. Computer system 1200 may include a microprocessor. Computer system 1200 may comprise programmable or special purpose circuitry. Computer system 1200 may be distributed among multiple devices, processors, storage, and/or interfaces that together comprise elements 1220-1270.

Communication interface 1220 may comprise a network interface, modem, port, bus, link, transceiver, or other communication device. Communication interface 1220 may be distributed among multiple communication devices. Processing system 1230 may comprise a microprocessor, microcontroller, logic circuit, or other processing device. Processing system 1230 may be distributed among multiple processing devices. User interface 1260 may comprise a keyboard, mouse, voice recognition interface, microphone and speakers, graphical display, touch screen, or other type of user interface device. User interface 1260 may be distributed among multiple interface devices. Storage system 1240 may comprise a disk, tape, integrated circuit, RAM, ROM, EEPROM, flash memory, network storage, server, or other memory function. Storage system 1240 may include computer readable medium. Storage system 1240 may be distributed among multiple memory devices.

Processing system 1230 retrieves and executes software 1250 from storage system 1240. Processing system 1230 may retrieve and store data 1270. Processing system 1230 may also retrieve and store data via communication interface 1220. Processing system 1230 may create or modify software 1250 or data 1270 to achieve a tangible result. Processing system 1230 may control communication interface 1220 or user interface 1260 to achieve a tangible result. Processing system 1230 may retrieve and execute remotely stored software via communication interface 1220.

Software 1250 and remotely stored software may comprise an operating system, utilities, drivers, networking software, and other software typically executed by a computer system. Software 1250 may comprise an application program, applet, firmware, or other form of machine-readable processing instructions typically executed by a computer system. When executed by processing system 1230, software 1250 or remotely stored software may direct computer system 1200 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. An integrated circuit, comprising:
a first power supply node;
a second power supply node;
an intermediate node;
a first receiver circuit connected between the first power supply node and the intermediate node, the first receiver circuit configured to be coupled to a first differential signal having a first common-mode voltage, the first receiver circuit comprising a first control input that adjusts a first input common-mode voltage; and,
a second receiver circuit connected between the intermediate node and the second power supply node, the second receiver circuit configured to be coupled to a second differential signal having a second common-mode voltage, the second receiver circuit comprising a second control input that adjusts a second input common-mode voltage, the second receiver circuit receiving positive power supply current from the intermediate node.

2. The integrated circuit of claim 1, further comprising:
control circuitry coupled to the first control input and the second control input, the control circuitry configured to adjust the first input common-mode voltage to approximate the first common-mode voltage, and to adjust the second input common-mode voltage to approximate the second common-mode voltage.

3. The integrated circuit of claim 1, wherein the first input common-mode voltage is to approximate the first common-mode voltage and the second input common-mode voltage is to approximate the second common-mode voltage.

4. The integrated circuit of claim 1, wherein the first input common-mode voltage is to approximate a first reference voltage and the second input common-mode voltage is to approximate a second reference voltage.

5. The integrated circuit of claim 4, wherein the first reference voltage is to approximate the first common-mode voltage and the second reference voltage is to approximate the second common-mode voltage.

6. An integrated circuit, comprising:
a first power supply node;
a second power supply node;
a first receiver circuit connected between the first power supply node and a first intermediate node, the first receiver circuit configured to be coupled to a first signal having a first common-mode voltage, the first receiver circuit to resolve a first signal value corresponding to the first signal at a first time; and,
a second receiver circuit connected between the first intermediate node and the second power supply node, the second receiver circuit configured to be coupled to a second signal having a second common-mode voltage, the second receiver circuit to resolve a second signal value corresponding to the second signal at a second time, the second receiver circuit to be quiescent during the first time, the second receiver circuit receiving positive power supply current from the first intermediate node.

7. The integrated circuit of claim 6, wherein the first receiver circuit is to be quiescent during the second time.

8. The integrated circuit of claim 6, further comprising:
a third receiver circuit connected between the first power supply node and a second intermediate node, the third receiver circuit configured to be coupled to the first signal, the third receiver circuit to resolve a third signal value corresponding to the first signal at the second time; and,
a fourth receiver circuit connected between the second intermediate node and the second power supply node, the fourth receiver circuit configured to be coupled to the second signal, the fourth receiver circuit to resolve a fourth signal value corresponding to the second signal at the first time, the fourth receiver circuit to be quiescent during the second time.

9. The integrated circuit of claim 8, wherein the third receiver circuit is to be quiescent during the first time.

10. An integrated circuit, comprising:
a first pair of transistors to receive a first differential signal having a first common-mode voltage;
a second pair of transistors to receive a second differential signal having a second common-mode voltage, the second pair of transistors to receive current that has passed through the first pair of transistors;
a first regenerative amplifier to convert first signals received from the first pair of transistors to an output signal, the first signals corresponding to the first differential signal; and,
a second regenerative amplifier to convert second signals received from the second pair of transistors to the output signal, the second signals corresponding to the second differential signal.

11. The integrated circuit of claim 10, wherein when the second regenerative amplifier is receiving the second signals from the second pair of transistor, the first pair of transistors is operating to effectively provide a power supply for the second regenerative amplifier.

12. The integrated circuit of claim 10, wherein when the first regenerative amplifier is receiving the first signals from the first pair of transistor, the second pair of transistors is operating to effectively provide a power supply for the first regenerative amplifier.

13. The integrated circuit of claim 10, wherein the first transistor pair and the second transistor pair are to alternately operate to provide first signals to the first regenerative amplifier and second signals to the second regenerative amplifier, respectively, while the second transistor pair and the first transistor pair are operating to effectively provide a power supply for the second regenerative amplifier and the first regenerative amplifier, respectively.

14. The integrated circuit of claim 10, wherein the first regenerative amplifier and the second regenerative amplifier are coupled between the first transistor pair and the second transistor pair.

15. The integrated circuit of claim 14, wherein the second regenerative amplifier receives a first power supply current that has passed through the first transistor pair and the first regenerative amplifier sends a power supply current to pass through the second transistor pair.

16. The integrated circuit of claim 10, wherein the first regenerative amplifier is responsive to a first signal to convert the first signals and the second regenerative amplifier is responsive to a second signal to convert the second signals.

17. The integrated circuit of claim 16, wherein the first signal is active to control the first regenerative amplifier to convert the first signals during time when the second signal is not active to control the second regenerative amplifier to convert the second signals.

18. The integrated circuit of claim 10, wherein the first common-mode voltage is less than the second common-mode voltage.

* * * * *